United States Patent
Cho et al.

(10) Patent No.: US 9,595,575 B2
(45) Date of Patent: Mar. 14, 2017

(54) ORGANIC LIGHT-EMITTING DIODE DISPLAY

(71) Applicant: Samsung Display Co., Ltd., Yongin (KR)

(72) Inventors: Kyonghun Cho, Yongin (KR); Jaeyoung Park, Yongin (KR); Jaeho Lee, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/734,313

(22) Filed: Jun. 9, 2015

(65) Prior Publication Data

US 2016/0126304 A1 May 5, 2016

(30) Foreign Application Priority Data

Nov. 3, 2014 (KR) ........................ 10-2014-0151586

(51) Int. Cl.
*H01L 27/32* (2006.01)
*H01L 51/52* (2006.01)

(52) U.S. Cl.
CPC ...... *H01L 27/3276* (2013.01); *H01L 27/3246* (2013.01); *H01L 51/5228* (2013.01)

(58) Field of Classification Search
CPC . H01L 27/32; H01L 27/3276; H01L 27/3246; H01L 51/5228
See application file for complete search history.

(56) References Cited

U.S. PATENT DOCUMENTS

| | | | |
|---|---|---|---|
| 2005/0162081 A1 | 7/2005 | Kwak et al. | |
| 2009/0174322 A1* | 7/2009 | Chan | H01L 51/5253 313/504 |
| 2010/0051958 A1* | 3/2010 | Izumida | H01L 51/5203 257/72 |
| 2010/0102335 A1* | 4/2010 | Takagi | H01L 27/3276 257/88 |
| 2012/0050344 A1 | 3/2012 | Kim et al. | |
| 2012/0111841 A1 | 5/2012 | Murison et al. | |

(Continued)

FOREIGN PATENT DOCUMENTS

| | | |
|---|---|---|
| JP | 2010-108693 | 5/2010 |
| KR | 10-2005-0072007 | 7/2005 |

(Continued)

*Primary Examiner* — Phuc Dang
(74) *Attorney, Agent, or Firm* — H.C. Park & Associates, PLC

(57) ABSTRACT

An organic light-emitting diode (OLED) display includes pixel electrodes, each pixel electrode corresponding to a pixel region disposed in a display region of a substrate, a first pixel region disposed at a center portion of the display region, a second pixel region disposed at an edge portion of the display region, auxiliary lines, each auxiliary line disposed adjacent to at least one pixel electrode, emission layers disposed on the pixel electrodes, and an opposite electrode disposed on the emission layers, the opposite electrode contacting each of the auxiliary lines through contact holes, wherein a total contact area between the opposite electrode and an auxiliary line in the first pixel region is greater than a total contact area between the opposite electrode and the auxiliary line in the second pixel region.

15 Claims, 34 Drawing Sheets

(56) References Cited

U.S. PATENT DOCUMENTS

2015/0236081 A1* 8/2015 Kim .................... H01L 27/3262
257/40
2015/0303245 A1* 10/2015 Kashiwabara ...... H01L 27/3258
257/40

FOREIGN PATENT DOCUMENTS

| KR | 10-2012-0019016 | 3/2012 |
| KR | 10-2013-0069593 | 6/2013 |

* cited by examiner

ORGANIC LIGHT-EMITTING DIODE DISPLAY

CROSS REFERENCE TO RELATED APPLICATION

This application claims priority from and the benefit of Korean Patent Application No. 10-2014-0151586, filed on Nov. 3, 2014, which is hereby incorporated by reference for all purposes as if fully set forth herein.

BACKGROUND

Field

Exemplary embodiments relate to an organic light-emitting diode (OLED) display and a manufacturing method thereof.

Discussion of the Background

An OLED display is a display apparatus in which each of the pixels includes an organic light-emitting device. For example, the organic light-emitting device may include a pixel electrode, an opposite electrode disposed facing the pixel electrode, and an organic layer interposed between the pixel electrode and the opposite electrode and including an emission layer. In the OLED display, the pixel electrodes may be patterned for each pixel as an island form. The opposite electrode may be integrally formed with a plurality of pixels.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide an organic light-emitting diode (OLED) display and a manufacturing method thereof.

Additional aspects will be set forth in the detailed description which follows, and, in part, will be apparent from the disclosure, or may be learned by practice of the inventive concept.

According to an exemplary embodiment of the inventive concept, an organic light-emitting diode (OLED) display includes pixel electrodes, each pixel electrode corresponding to a pixel region disposed in a display region of a substrate, a first pixel region disposed at a center portion of the display region, a second pixel region disposed at an edge portion of the display region, auxiliary lines, each auxiliary line disposed adjacent to at least one pixel electrode, emission layers disposed on the pixel electrodes, and an opposite electrode disposed on the emission layers, the opposite electrode contacting each of the auxiliary lines through contact holes, wherein a total contact area between the opposite electrode and an auxiliary line in the first pixel region is greater than a total contact area between the opposite electrode and the auxiliary line in the second pixel region.

According to an exemplary embodiment of the inventive concept, a method of manufacturing an organic light-emitting diode (OLED) display includes forming pixel electrodes, the pixel electrodes corresponding to pixel regions disposed in a display region of a substrate, forming an auxiliary line adjacent to the pixel electrodes, forming a pixel define layer comprising first openings disposed on each of the pixel electrodes and second openings disposed in the auxiliary line, the pixel define layer disposed between the pixel electrodes and the auxiliary line, forming an intermediate layer on an upper surface of the pixel define layer, the pixel electrodes, and the auxiliary line, forming an emission layer in the first opening, removing sections of the intermediate layer to expose the auxiliary line to form contact holes, and forming an opposite electrode, the opposite electrode contacting the auxiliary line via the contact holes, wherein, a total contact area at the contact holes between the opposite electrode and the auxiliary line in a first pixel region disposed at a center portion of the display region is larger than a total contact area at the contact holes between the opposite electrode and the auxiliary line in a second pixel region disposed at an edge portion of the display region.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
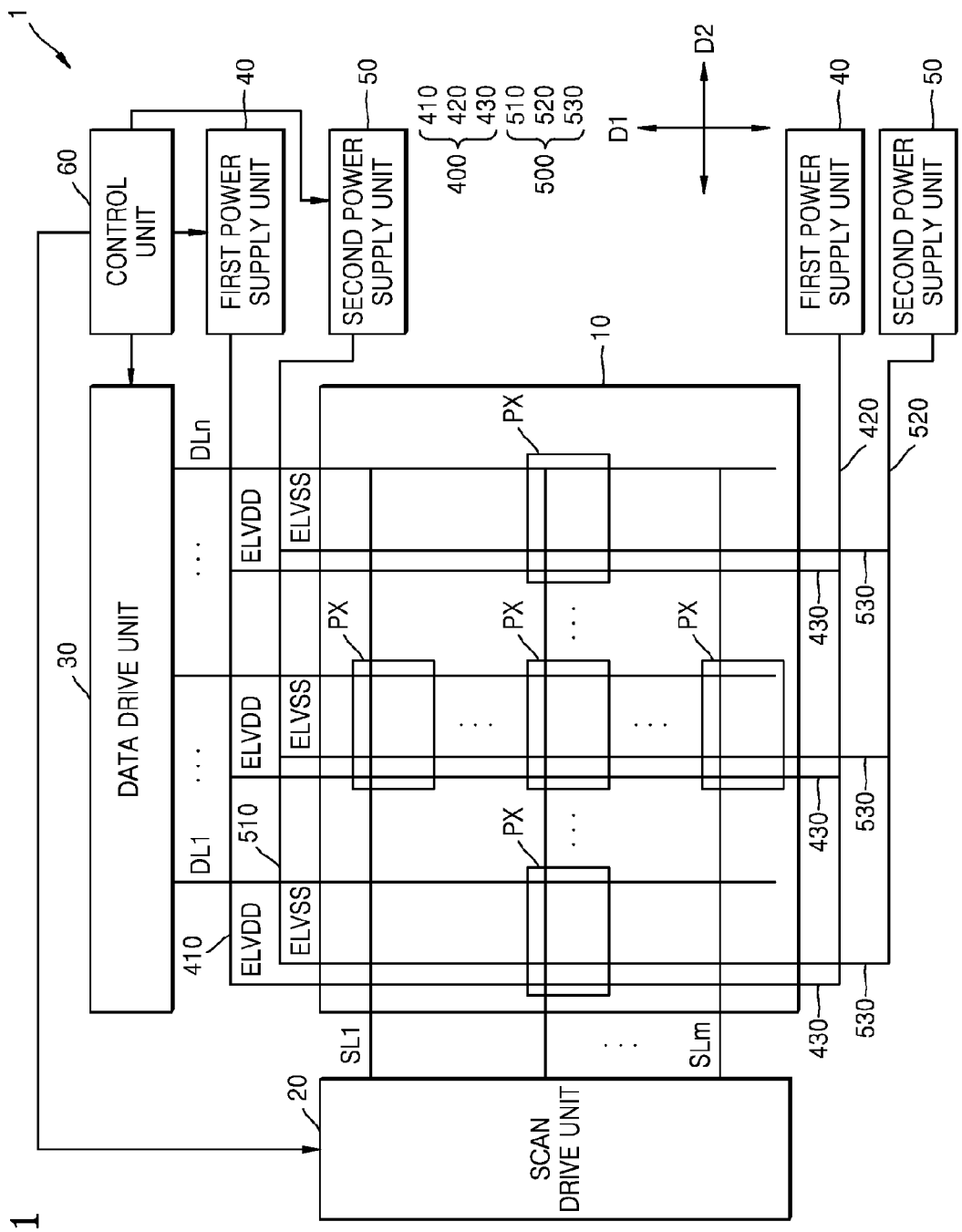
FIG. 1 is a block diagram schematically illustrating an organic light-emitting diode (OLED) display according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a block diagram schematically illustrating an organic light-emitting diode (OLED) display 1 according to an exemplary embodiment.

Referring to FIG. 1, the OLED display 1 according to an exemplary embodiment may include a display unit 10, a scan drive unit 20, a data drive unit 30, a first power supply unit 40, a second power supply unit 50, and a control unit 60.

The display unit 10 may include a plurality of pixels PX arranged approximately in a matrix format and located in intersection regions of a plurality of scan lines SL1-SLm for applying scan signals and a plurality of data lines DL1-DLn for applying data signals. Each of the pixels PX may be connected to respective scan lines SL, data lines DL, and lines for applying a first power voltage ELVDD and a second power voltage ELVSS. The pixel PX may include a pixel circuit including a plurality of thin film transistors and storage capacitors, and an organic light-emitting device (OLED).

The scan drive unit 20 generates a scan signal and transmits the generated scan signal to each pixel PX through the scan lines SL1-SLm. The data drive unit 30 generates a data signal and transmits the generated data signal to each pixel PX through the data lines DL1-DLn. The scan lines SL-SLm are respectively connected to the pixels PX arranged in the same row. The data lines DL1-DLn are respectively connected to the pixels PX arranged in the same column. The pixels PX may emit light or may not emit light according to levels of data signals received through the data lines DL1-DLn in response to scan signals received through the scan lines SL1-SLm.

The control unit 60 may receive image data and control the scan drive unit 20, the data drive unit 30, the first power supply unit 40, and the second power supply unit 50. The control unit 60 may generate a plurality of control signals and digital data. The control unit 60 may provide the generated control signals to the scan drive unit 20, provide the generated control signals and the digital data to the data drive unit 30, and provide the control signals to the first and second power supply units 40 and 50.

The first power supply unit 40 and the second power supply unit 50 may respectively generate the first power voltage ELVDD and the second power voltage ELVSS under control of the control unit 60. The first power voltage ELVDD generated by the first power supply unit 40 and the second power voltage ELVSS generated by the second power supply unit 50 are provided to the pixel PX. A voltage level of the first power voltage ELVDD higher than that of the second power voltage ELVSS. For example, the first power voltage ELVDD may be applied to an anode of the organic light-emitting device and the second power voltage ELVSS may be applied to a cathode thereof.

The first power voltage ELVDD and the second power voltage ELVSS may be provided to the pixels PX through a power line network formed in the display unit 10. A first power voltage line 400 for providing the first power voltage ELVDD to each of the pixels PX, as illustrated in FIG. 1, may include the main power lines 410 and 420 disposed parallel to each other, and a plurality of the auxiliary lines 430 that are parallel to each other and connect the main power lines 410 and 420.

The main power lines 410 and 420 are arranged outside the display unit 10 and extended in a second direction D2. The auxiliary lines 430 are connected to the main power lines 410 and 420 at opposing ends of the display unit 10 and extend parallel to each other in a first direction D1. Each of the auxiliary lines 430 is electrically connected to a pixel circuit that is provided at each of the pixels PX arranged in the first direction D1, and provides the first power voltage ELVDD.

Figure 2:
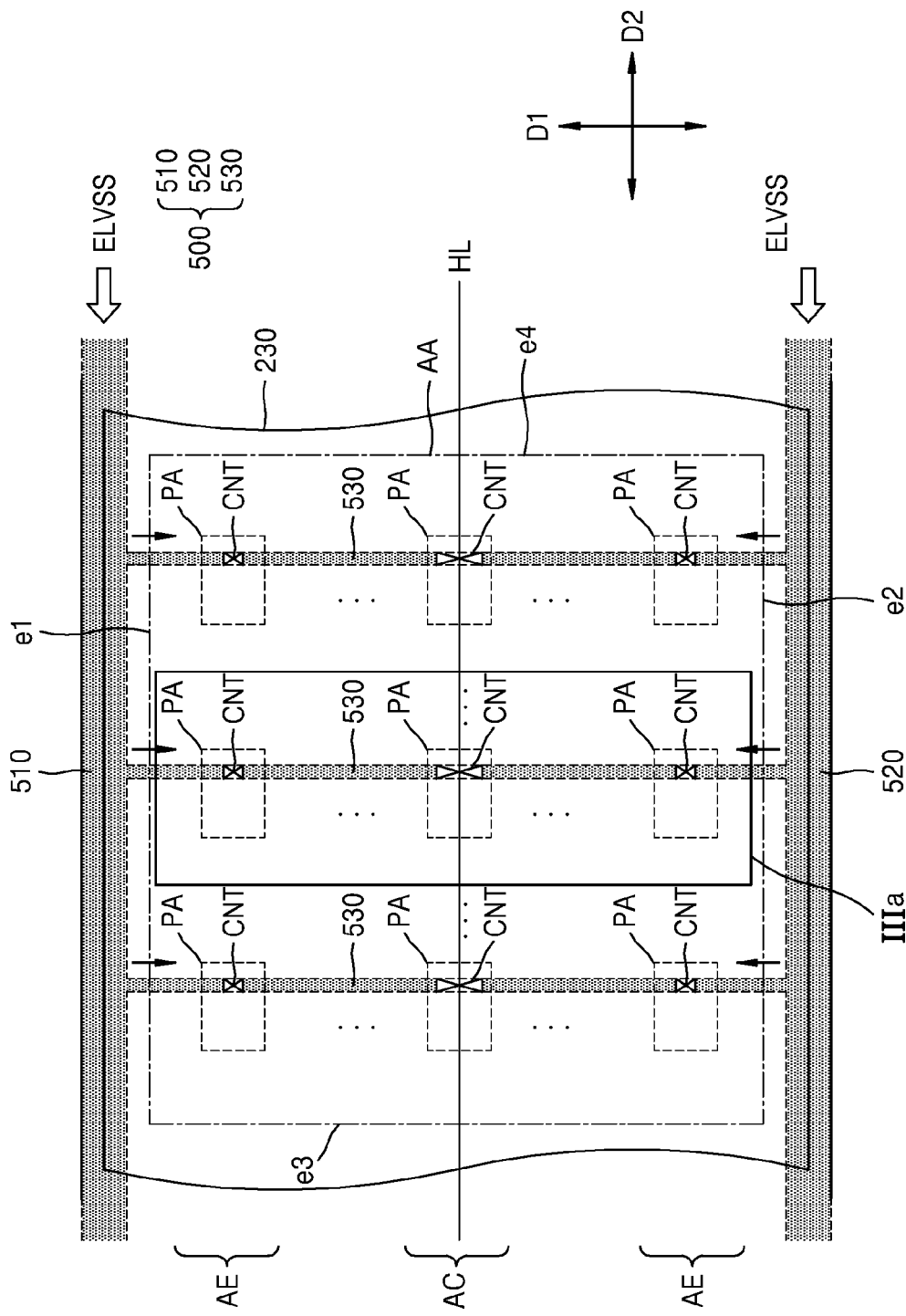
FIG. 2 is a plan view illustrating an electrical connection between a second power voltage line and an opposite electrode of the OLED display of FIG. 1.

A second power voltage line 500 for applying the second power voltage ELVSS to an the opposite electrode 230 (see FIG. 2), as illustrated in FIGS. 1 and 2, may include main power lines 510 and 520 that are parallel to each other, and a plurality of the auxiliary lines 530 disposed parallel to each other and connecting the main power lines 510 and 520. The main power lines 510 and 520 are extended in the second direction D2, and the auxiliary lines 530 are connected to the main power lines 510 and 520 at the opposing ends of the display unit 10 and extend parallel to each other in the first direction D1. The second power voltage line 500 is electrically connected to the opposite electrode 230 and applies the second power voltage ELVSS to the opposite electrode 230.

An electrical connection between the second power voltage line 500 and the opposite electrode 230 is described below with reference to FIG. 2.

FIG. 2 is a plan view illustrating an electrical connection between the second power voltage line 500 and the opposite electrode 230 of the OLED display 1 of FIG. 1.

Referring to FIG. 2, a display region AA may include a plurality of pixel regions PA. The pixel PX is formed in each of the pixel regions PA. The display region AA may include a center portion AC and an edge portion AE. The center portion AC may include one or more pixel regions PA, and the edge portion AE may include one or more pixel regions PA. The pixel regions PA may be arranged from the center portion AC to the edge portion AE, including in the center portion AC and the edge portion AE.

The opposite electrode 230 may be formed to cover the entire surface of the display region AA, and a pair of main power lines 510 and 520 may be arranged at the opposing ends of the display region AA.

Of the main power lines 510 and 520, any one main power line (hereinafter, referred to as the first main power line), for example, the main power line 510, extends in the second direction D2. The other main power line (hereinafter, referred to as the second main power line), for example, the main power line 520, extends in the second direction D2 and is disposed separate from the first main power line 510.

The first and second main power lines 510 and 520 may be electrically connected to the opposite electrode 230, and the second power voltage ELVSS generated by the second power supply unit 50 may be applied to the opposite electrode 230 through the first and second main power lines 510 and 520. In an exemplary embodiment, at least a part of the first and second main power lines 510 and 520 directly contacts the opposite electrode 230 to be electrically connected to the opposite electrode 230. However, this is merely exemplary. For example, the first and second main power lines 510 and 520 may, instead, be electrically connected to the opposite electrode 230 via a medium layer or a medium structure (not shown) such as a conductive layer or a bridge line.

The auxiliary lines 530 are coupled to the first main power line 510 and second main power line 520 and extend in the first direction D1. First direction D1 is a direction that is perpendicular to the second direction D2 and crosses the display region AA. The auxiliary lines 530 are arranged to be separated from each other and parallel to each other. Each of the auxiliary lines 530 may be disposed to correspond to each column made by the pixels PX arranged in the first direction D1. The auxiliary lines 530 may contact the opposite electrode 230 via a contact region CNT, and the contact region CNT may be arranged at each of the pixels PX.

Since the opposite electrode 230 is formed over the entire surface of the display region AA, if the second power voltage ELVSS is provided to the opposite electrode 230 only through the first and second main power lines 510 and 520, a deviation in the brightness may occur due to a voltage drop (IR drop) that may be generated in the opposite electrode 230. However, according to the present exemplary embodiment, since the opposite electrode 230 and the auxiliary lines 530 contact each other, the IR drop that may occur in a comparative embodiment in which the auxiliary lines 530 do not exist may be reduced and, thus, brightness deviations may be reduced.

The first and second main power lines 510 and 520 may be respectively arranged along first and second long side portions e1 and e2 of the display region AA. The auxiliary lines 530 that connect the first and second main power lines 510 and 520 may be parallel to first and second short side portions e3 and e4 of the display region AA. That is, in comparative examples, the auxiliary lines 530 are disposed parallel to the first and second long side portions e1 and e2 of the display region AA, the auxiliary lines 530 may be long and, thus, an IR drop or the brightness deviation may be generated due to an increase in the line resistance because of the increased length.

Since the first and second main power lines 510 and 520 are arranged outside the display region AA, the widths of the first and second main power lines 510 and 520 may be larger than widths of the auxiliary lines 530. Accordingly, as the first and second main power lines 510 and 520 have lower line resistances than that of the auxiliary lines 530, an IR drop generated by the flow of current may be negligibly small. However, since the auxiliary lines 530 extend to cross the display region AA, the line width of the auxiliary lines 530 may be small. Accordingly, in a comparative example, line resistance of the auxiliary lines 530 is larger than those of the first and second main power lines 510 and 520. In this case, an IR drop due to the auxiliary lines 530 may be generated, and such a phenomenon may become severe as the size of an OLED display increases.

However, according to the exemplary embodiments of the present invention, regarding the IR drop due to the auxiliary lines 530, since a total contact area according to a position where the auxiliary lines 530 and the opposite electrode 230 contact each other is formed differently, the IR drop due to the line resistance of the auxiliary lines 530 and the resulting brightness deviation may be addressed.

For example, a total area of the contact region CNT in the pixel region corresponding to the center portion AC of the display region AA (hereinafter, referred to as the first pixel region), which is disposed far from the first and second main power lines 510 and 520, and may have a relatively large IR drop, may be larger than a total area of the contact region CNT in the pixel region corresponding to the edge portion AE of the display region AA (hereinafter, referred to as the second pixel region), which is arranged close to the first and second main power lines 510 and 520 and may have a relatively small IR drop. In other words, the total contact area between the auxiliary lines 530 and the opposite electrode 230 in the first pixel region may be larger than the total contact area between the auxiliary lines 530 and the opposite electrode 230 in the second pixel region.

The total contact area between the auxiliary lines 530 and the opposite electrode 230 may be adjusted by adjusting the size and/or number of contact holes that connect the auxiliary lines 530 and the opposite electrode 230. The total contact area between the auxiliary lines 530 and the opposite electrode 230 for each pixel region is described below.

Figure 3A:
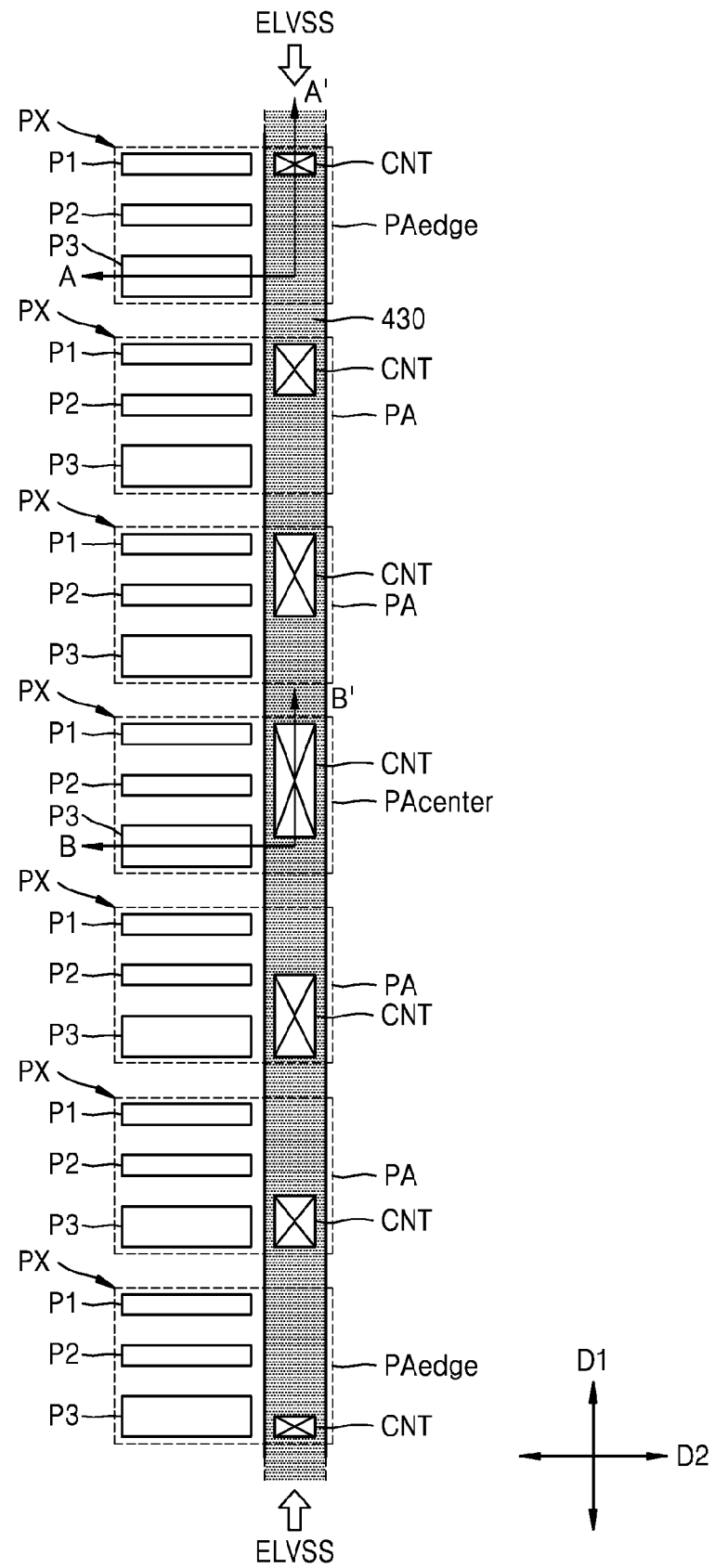
FIG. 3A is a plan view, corresponding to area IIIa of FIG. 2, illustrating pixel regions according to an exemplary embodiment.
Figure 3B:
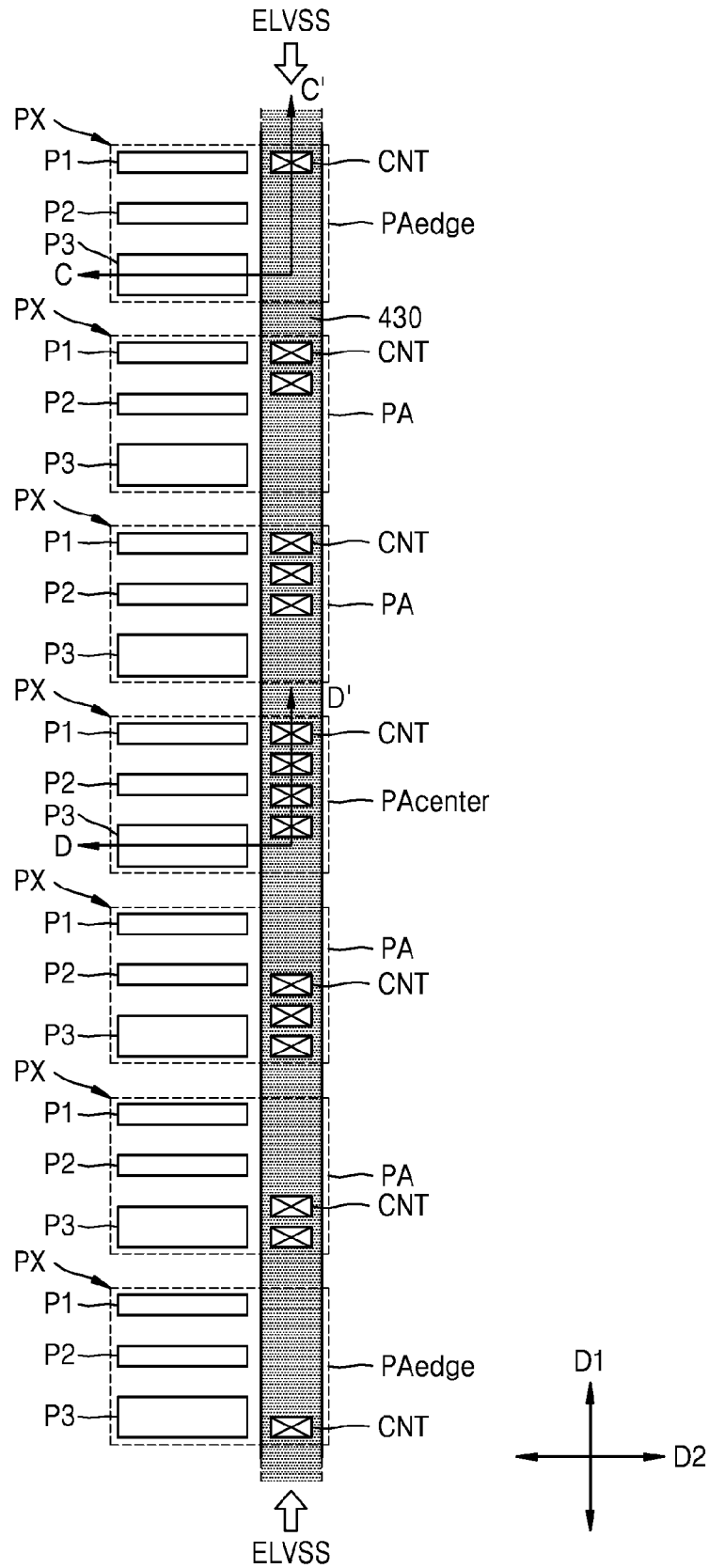
FIG. 3B illustrates a modified exemplary embodiment of FIG. 3A.

FIG. 3A is a plan view, which corresponds to region IIIa of FIG. 2, illustrating the pixel regions PA (including PAedge and PAcenter) corresponding to the pixels PX arranged in the first direction D1 and the auxiliary line 530 in an OLED display according to an exemplary embodiment. FIG. 3B illustrates a modified exemplary embodiment of FIG. 3A.

Referring to FIG. 3A, each of the pixels PX formed in the pixel regions PA (including PAedge and PAcenter) may include a plurality of sub pixels P1, P2, and P3. Although FIG. 3A illustrates that the three sub pixels P1, P2, and P3 of red, green, and blue form the pixel PX, exemplary embodiments of the present inventive concept are not limited thereto. For example, four sub pixels (not shown) of red, green, blue, and white may form the pixel PX.

The size of a contact hole between the auxiliary line 530 and the opposite electrode 230 in the first pixel region PAcenter may be larger than that of a contact hole between the auxiliary line 530 and the opposite electrode 230 in the second pixel region PAedge. Accordingly, the size of the contact region CNT between the auxiliary line 530 and the opposite electrode 230 in the first pixel region PAcenter may be larger than that of the contact region CNT between the auxiliary line 530 and the opposite electrode 230 in the second pixel region PAedge.

As described above, since the first and second main power lines 510 and 520 are formed at the opposing ends of the auxiliary line 530 and the second power voltage ELVSS is applied through the opposing ends of the auxiliary line 530, the sizes of the contact holes may be formed symmetrically with respect to an imaginary bisector HL (see FIG. 2) that crosses the center portion AC of the display region AA. The size of the contact hole may gradually decrease from the first pixel region PAcenter toward the second pixel region PAedge in accordance with the IR drop due to the line resistance of the auxiliary line 530.

Additionally or alternatively to the exemplary embodiment shown in FIG. 3A, referring to FIG. 3B, the number of the contact holes between the auxiliary line 530 and the opposite electrode 230 in the first pixel region PAcenter may be greater than that of the contact holes between the auxiliary line 530 and the opposite electrode 230 in the second pixel region PAedge. Accordingly, the number of the contact regions CNT between the auxiliary line 530 and the opposite electrode 230 in the first pixel region PAcenter may be greater than that of the contact regions CNT between the auxiliary line 530 and the opposite electrode 230 in the second pixel region PAedge.

As described above, since the first and second main power lines 510 and 520 are formed at the opposing ends of the auxiliary line 530 and the second power voltage ELVSS is applied through the opposing ends of the auxiliary line 530, the number of the contact holes for each pixel region may be symmetrical with respect to the imaginary bisector HL (see FIG. 2) that crosses the center portion AC of the display region AA or the center of the first pixel region PAcenter. That is, the number of the contact holes may gradually decrease for the pixel regions in a direction from the first pixel region PAcenter toward the second pixel region PAedge according to the IR drop due to the line resistance of the auxiliary line 530.

Figure 4:
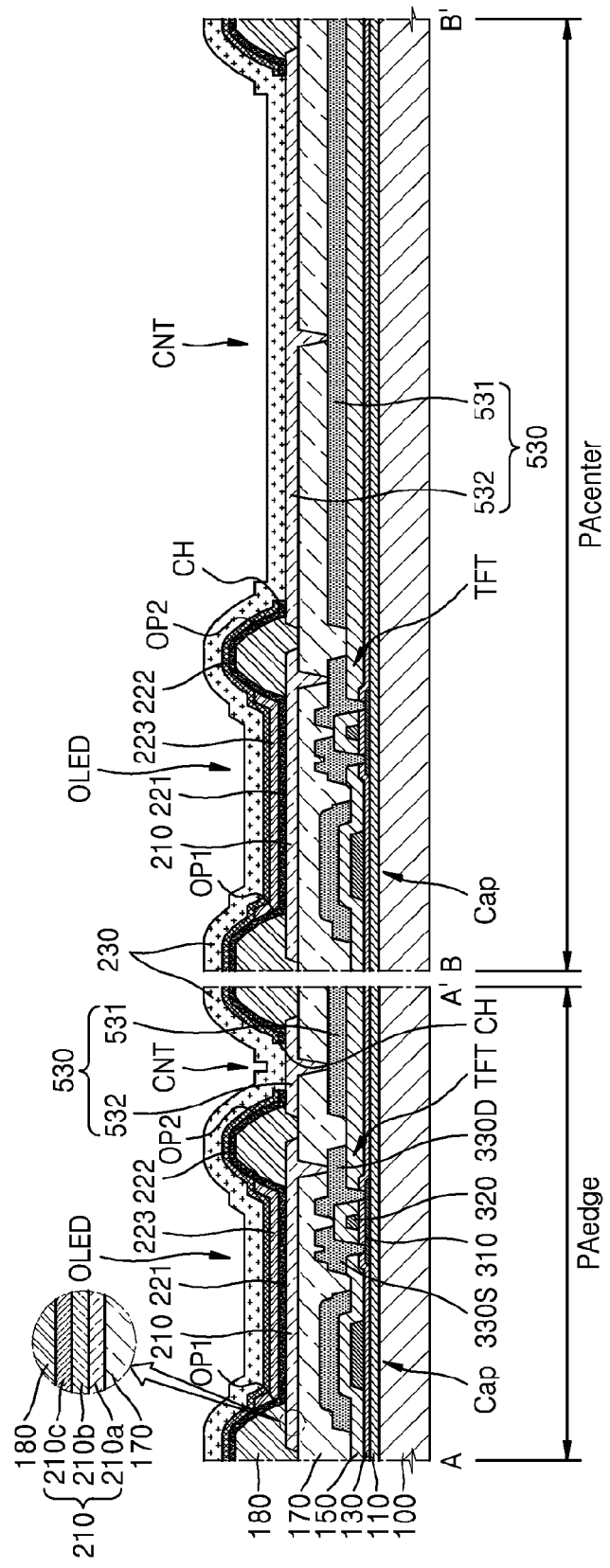
FIG. 4 is a cross-sectional view taken along lines A-A' and B-B' of FIG. 3A, illustrating a first pixel region and a second pixel region in an OLED display according to an exemplary embodiment.

FIG. 4 is a cross-sectional view taken along lines A-A' and B-B' of FIG. 3A, illustrating the first pixel region PAcenter and the second pixel region PAedge in an OLED display according to an exemplary embodiment.

Referring to FIG. 4, a thin film transistor (TFT), a storage capacitor Cap, an organic light-emitting device (OLED), and a contact hole CH that connects between the auxiliary line 530 and the opposite electrode 230 is formed on each of the first and second pixel regions PAcenter and PAedge formed on a substrate 100. The contact region CNT is formed where the auxiliary line 530 and the opposite electrode 230 contact each other through the contact hole CH. The size of the contact hole CH in the first pixel region PAcenter is larger than that of the contact hole CT in the second pixel region PAedge.

The substrate 100 may be formed of a variety of materials, including, for example, a glass material, a metal material, or a plastic material such as polyethylen terephthalate (PET), polyethylen naphthalate (PEN), or polyimide.

A buffer layer 110 to prevent intrusion of impurities into the semiconductor layer 310 of the thin film transistor TFT, a gate insulating layer 130 to insulate the semiconductor layer 310 and the gate electrode 320 of the thin film transistor TFT, an interlayer insulating layer 150 to insulate source and drain electrodes 330S and 330D and the gate electrode 320 of the thin film transistor TFT, and a planarization layer 170 that covers the thin film transistor TFT and has a roughly flat upper surface are formed above the substrate 100.

In the thin film transistor TFT, the gate electrode 320 may be formed on the semiconductor layer 310, and the source electrode 330S and the drain electrode 330D may be formed on the gate electrode 320. The storage capacitor Cap may include a lower electrode formed on the same layer as the gate electrode 320 and an upper electrode formed on the same layer as the source electrode 330S and the drain electrode 330D. The interlayer insulating layer 150 may determine the capacitance of the storage capacitor Cap.

A pixel electrode 210 may be formed on the planarization layer 170, and may electrically connect any one of the source electrode 330S and the drain electrode 330D of the thin film transistor TFT. The pixel electrode 210 is patterned for each pixel. The pixel electrode 210 may be a reflective electrode. For example, the pixel electrode 210 may include a reflective layer 210b formed of Ag, Mg, Al, Pt, Pd, Au, Ni, Nd, Ir, Cr, or a compound thereof, but is not limited thereto, and layers 210a and 210c respectively located in upper and lower sides of the reflective layer 210b and formed of indium tin oxide (ITO), indium zinc oxide (IZO), zinc oxide (ZnO), or indium oxide ($In_2O_3$), although not limited thereto.

The auxiliary line 530 may include a first auxiliary line layer 531 and a second auxiliary line layer 532 formed on the first auxiliary line layer 531. The first auxiliary line layer 531 may be located at the same layer as any one of the electrodes of the thin film transistor TFT. For example, the first auxiliary line layer 531 may be formed on the same layer as the source electrode 330S and the drain electrode 330D of the thin film transistor TFT. The second auxiliary line layer 532 may be formed on the same layer as the pixel electrode 210.

The first auxiliary line layer 531 is disposed on the same layer as the source and drain electrodes 330S and 330D and may be formed of the same material as the source and drain electrodes 330S and 330D, which may include a material having low resistance. The first auxiliary line layer 531 extends in the first direction D1 to be electrically connected to the first and second main power lines 510 and 520 (referring to FIG. 2). A current according to the second power voltage ELVSS flows through the first auxiliary line layer 531. The second power voltage ELVSS that is applied through the first auxiliary line layer 531 having a relatively low resistance may be applied to the opposite electrode 230 through the second auxiliary line layer 532.

The second auxiliary line layer 532 may be patterned as an island form at a position corresponding to the contact hole CH. Since the second auxiliary line layer 532 is interposed between the first auxiliary line layer 531 and the opposite electrode 230 instead of the first auxiliary line layer 531 and the opposite electrode 230 directly contacting each other, the contact region CNT may be designed in various ways by disposing a void in the planarization layer 170.

A pixel define layer 180 is located on the pixel electrode 210 and the auxiliary line 530, and may include a first opening OP1 exposing an upper portion of the pixel electrode 210 and a second opening OP2 exposing a part of the auxiliary line 530, that is, the second auxiliary line layer 532. The pixel define layer 180 may define a pixel through the first opening OP1 and may prevent generation of electric arc at an end portion of the pixel electrode 210 by increasing a distance between the end portion the pixel electrode 210 and the opposite electrode 230.

A first intermediate layer 221 may be located on the upper portion of the pixel electrode 210 exposed through the first opening OP1, an upper surface of the pixel define layer 180 located between the pixel electrode 210 and the auxiliary line 530, and the auxiliary line 530. The first intermediate layer 221 may be integrally formed on the pixels PX.

The first intermediate layer 221 may have multilayer or monolayer structure. For example, the first intermediate layer 221 may be a hole transport layer (HTL) having a monolayer structure. Alternatively, the first intermediate layer 221 may include a hole injection layer (HIL) and an HTL.

A second intermediate layer 222 may have a multilayer or monolayer structure. The second intermediate layer 222 may include an electron transport layer (ETL) and/or an electron injection layer (EIL).

An emission layer 223 may be interposed between the first intermediate layer 221 and the second intermediate layer 222, and may include a low molecular weight organic material or a polymer organic material that may emit, for example, red, green, blue, and/or white light.

In the present exemplary embodiment, although the emission layer 223 is provided between the first and second intermediate layers 221 and 222, exemplary embodiments of the present inventive concept are not limited thereto. For example, if the first intermediate layer 221 and the emission layer 223 are formed of a polymer material, the second intermediate layer 222 may be omitted. In this case, the emission layer 223 may be interposed between the first intermediate layer 221 and the opposite electrode 230.

The opposite electrode 230 may be integrally formed on a plurality of pixels PX. The opposite electrode 230 may be a light transmissive electrode and may include a plurality of layers. For example, the opposite electrode 230 may include a first layer formed of Li, Ca, LiF/Ca, LiF/Al, Al, Mg, or a compound thereof and a second layer formed of ITO, IZO, ZnO, or $In_2O_3$ and located at each of upper and/or lower sides of the first layer.

The first and second intermediate layers 221 and 222 may be formed at positions corresponding to the second opening OP2 of the pixel define layer 180 and may include the contact hole CH that exposes the auxiliary line 530. The opposite electrode 230 may contact the auxiliary line 530 through the contact hole CH. Since the size of the contact hole CH of the first pixel region PAcenter located at the center portion AC of the display region AA may be larger than that of the contact hole CH of the second pixel region PAedge located at the edge portion AE of the display region AA, the total contact area in the first pixel region PAcenter may be larger than that in the second pixel region PAedge.

Figure 5:
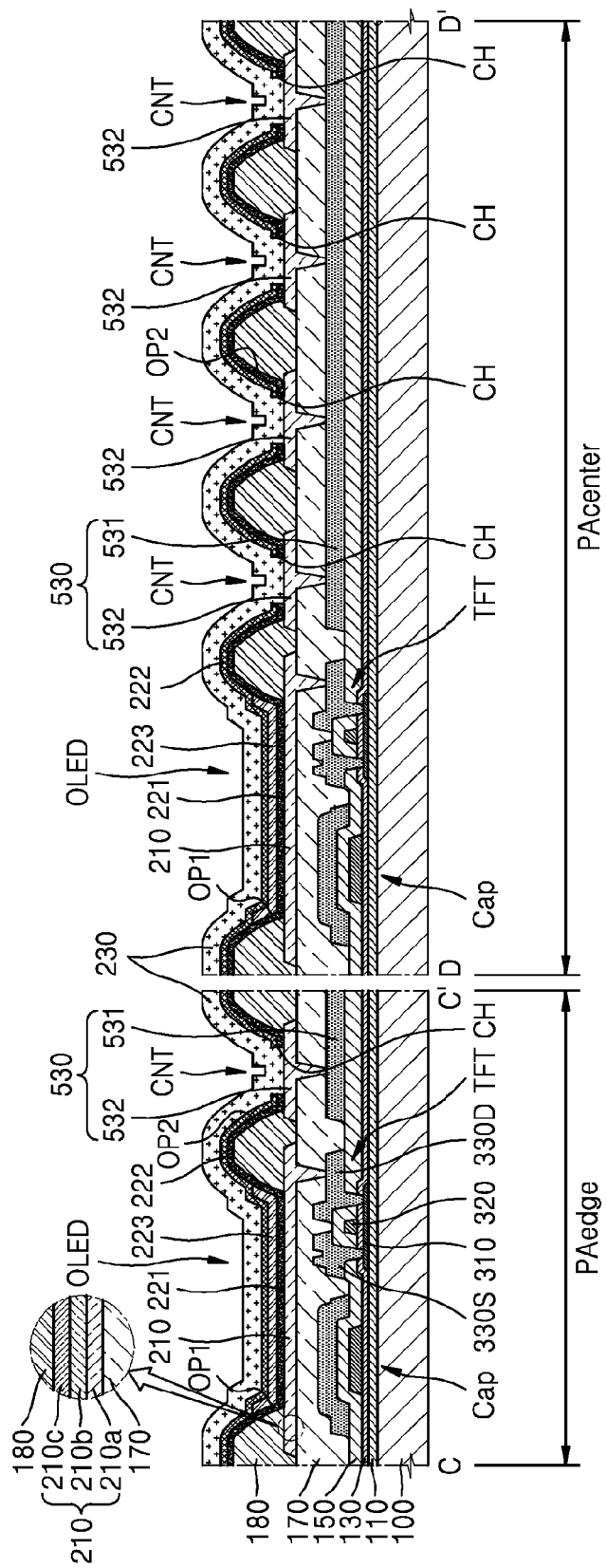
FIG. 5 is a cross-sectional view taken along lines C-C' and D-D' of FIG. 3B, illustrating a first pixel region and a second pixel region in an OLED display according to an exemplary embodiment.

FIG. 5 is a cross-sectional view taken along lines C-C' and D-D' of FIG. 3B, illustrating the first pixel region PAcenter and the second pixel region PAedge in an OLED display according to an exemplary embodiment.

Referring to FIG. 5, the OLED display according to an exemplary embodiment may have the same structure as that of the OLED display described with reference to FIG. 4, except for the number of the contact holes CH and the number of the contact regions CNT.

Where the auxiliary line 530 and the opposite electrode 230 contact each other through the contact hole CH formed in the first and second intermediate layers 221 and 222, the contact region CNT is formed. The number of the contact holes CH in the first pixel region PAcenter is be greater than that of the contact holes CH in the second pixel region PAedge. Accordingly, the total contact area in the first pixel region PAcenter is larger than that in the second pixel region PAedge.

The auxiliary line 530 may include the first auxiliary line layer 531 and the second auxiliary line layer 532. Since the second auxiliary line layer 532 is patterned in an island form corresponding to the contact hole CH, the number of the second auxiliary line layers 532 located in the first pixel region PAcenter may be the same as that of the contact holes CH.

Figure 6:
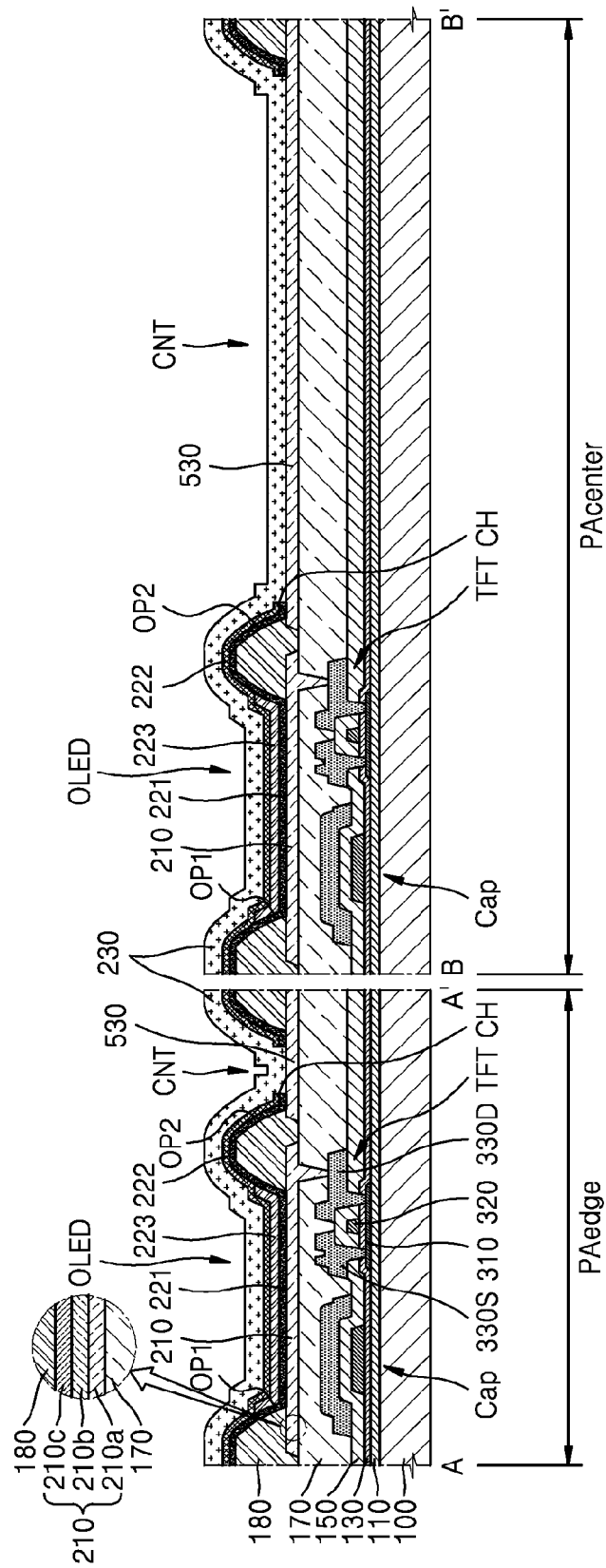
FIG. 6 is a cross-sectional view taken along lines A-A' and B-B' of FIG. 3A, illustrating a first pixel region and a second pixel region in an OLED display according to an exemplary embodiment.

FIG. 6 is a cross-sectional view taken along lines A-A' and B-B' of FIG. 3A, illustrating the first pixel region PAcenter and the second pixel region PAedge in an OLED display according to an exemplary embodiment.

Referring to FIG. 6, the OLED display according to an exemplary embodiment may have the same structure as that of the OLED display described with reference to FIG. 4, except for the structure of the auxiliary line 530.

According to the exemplary embodiment shown in FIG. 6, the auxiliary line 530 may be formed on the same layer as the pixel electrode 210 and formed of the same material as the pixel electrode 210. In this case, since lines and devices may be formed under the planarization layer 170, sufficient space for forming a pixel circuit may be secured.

The auxiliary line 530 formed on the same layer as the pixel electrode 210 contacts the opposite electrode 230 through the contact hole CH formed in the first and second intermediate layers 221 and 222, thereby forming the contact region CNT. A size of the contact hole CH in the first pixel region PAcenter may be larger than that of the contact hole CH in the second pixel region PAedge. Accordingly, the total contact area in the first pixel region PAcenter is larger than that in the second pixel region PAedge.

Figure 7:
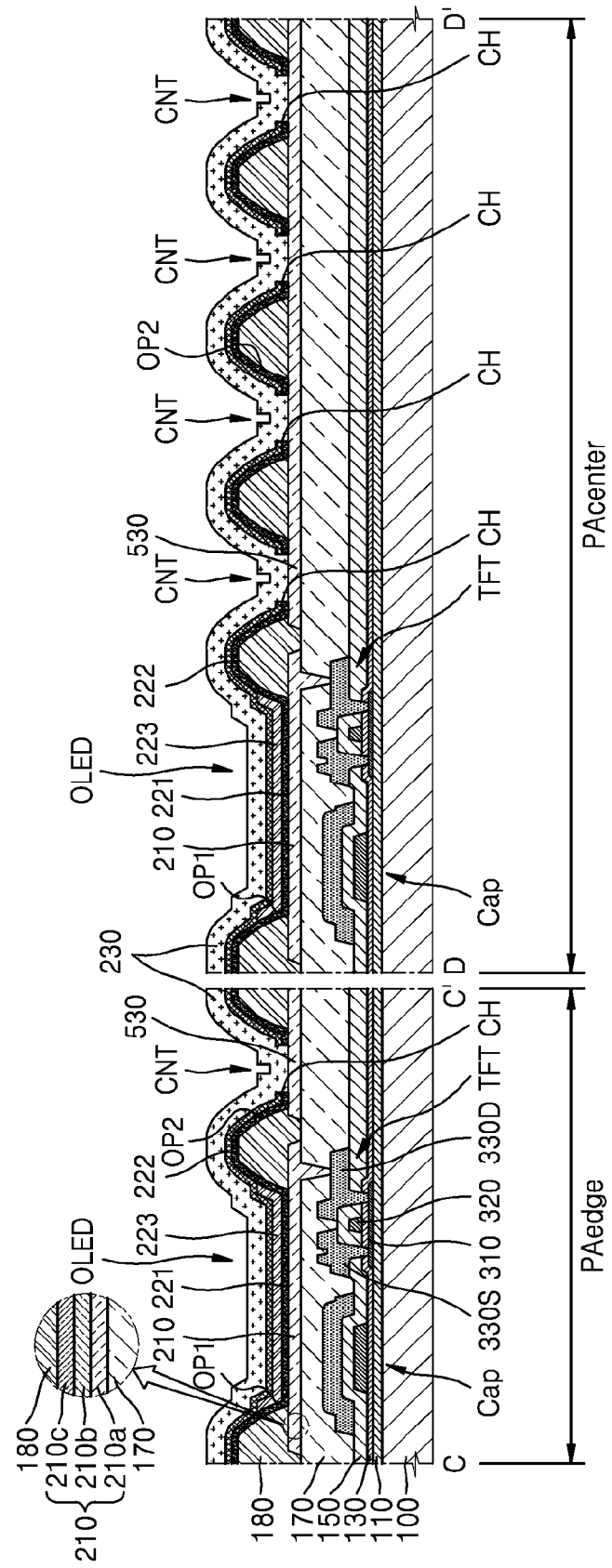
FIG. 7 is a cross-sectional view taken along lines C-C' and D-D' of FIG. 3B, illustrating a first pixel region and a second pixel region in an OLED display according to an exemplary embodiment.

FIG. 7 is a cross-sectional view taken along lines C-C' and D-D' of FIG. 3B, illustrating the first pixel region PAcenter and the second pixel region PAedge in an OLED display according to an exemplary embodiment.

Referring to FIG. 7, the OLED display may have the same structure as that of the OLED display described with reference to FIG. 6, except for the number of the contact holes CH and the number of the contact regions CNT formed according thereto.

Where the auxiliary line 530 and the opposite electrode 230 contact each other through the contact hole CH formed in the first and second intermediate layers 221 and 222, the contact region CNT is formed. The auxiliary line 530 may be formed on the same layer as the pixel electrode 210 and may be formed of the same material as the pixel electrode 210.

The number of the contact holes CH in the first pixel region PAcenter may be greater than that of the contact holes CH in the second pixel region PAedge. Accordingly, the total contact area in the first pixel region PAcenter may be larger than that in the second pixel region PAedge.

Figure 8:
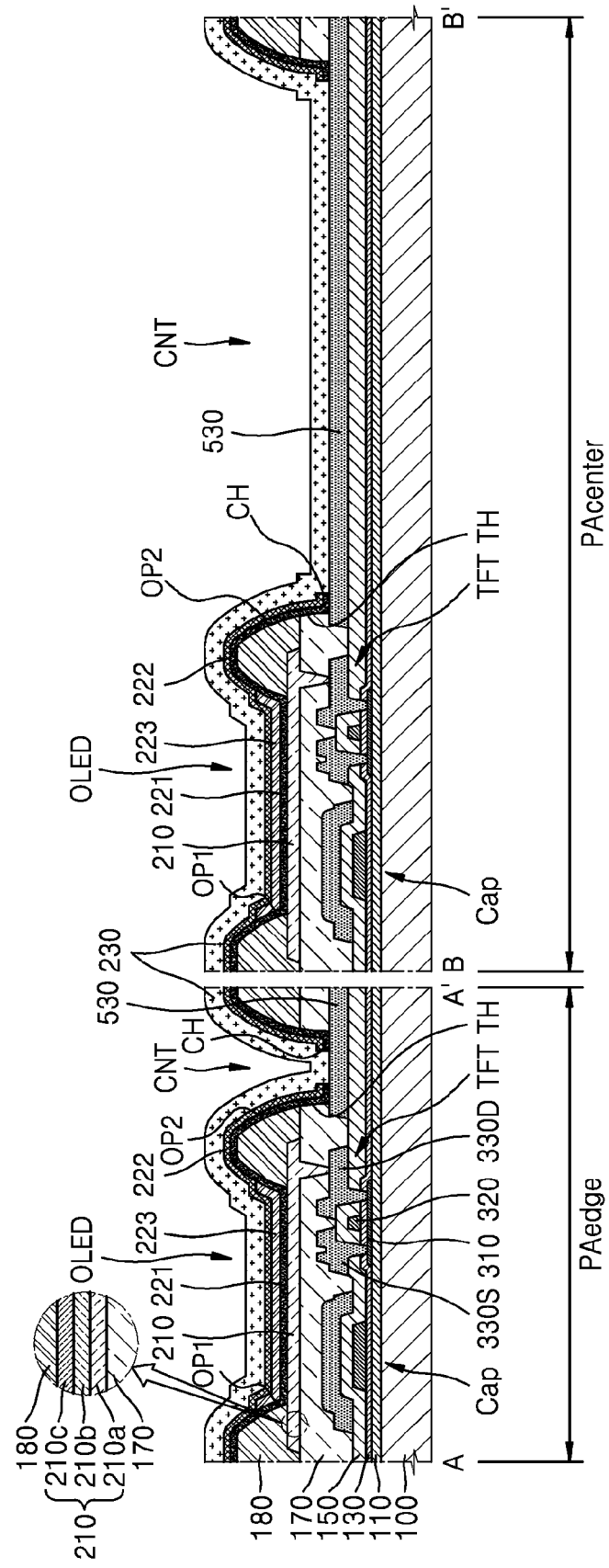
FIG. 8 is a cross-sectional view taken along lines A-A' and B-B' of FIG. 3A, illustrating a first pixel region and a second pixel region in an OLED display according to an exemplary embodiment.

FIG. 8 is a cross-sectional view taken along lines A-A' and B-B' of FIG. 3A, illustrating the first pixel region PAcenter and the second pixel region PAedge in an OLED display according to an exemplary embodiment.

Referring to FIG. 8, the OLED display according to the present exemplary embodiment may have the same structure as that of the OLED display described with reference to FIG. 4, except for the structure of the auxiliary line 530.

According to the exemplary embodiment shown in FIG. 8, the auxiliary line 530 may be formed on the same layer as at least one electrode of the thin film transistor TFT. For example, the auxiliary line 530 may be formed on the same layer as the source and drain electrodes 330S and 330D and formed of the same material as the source and drain electrodes 330S and 330D.

Since the source electrode 330S and the drain electrode 330D are covered by the planarization layer 170, the planarization layer 170 may include a through hole TH formed at a position corresponding to the second opening OP2 to expose the upper portion of the auxiliary line 530. The second opening OP2 and the through hole TH may be of substantially the same size, and the size of the contact hole CH may be equal to or smaller than the size of each of the second opening OP2 and the through hole TH.

The auxiliary line 530 formed on the same layer as the source and drain electrodes 330S and 330D contacts the opposite electrode 230 through the contact hole CH formed in the first and second intermediate layers 221 and 222, thereby forming the contact region CNT.

The size of the contact hole CH in the first pixel region PAcenter is larger than that of the contact hole CH in the second pixel region PAedge. Accordingly, the total contact area in the first pixel region PAcenter is larger than that in the second pixel region PAedge.

Figure 9:
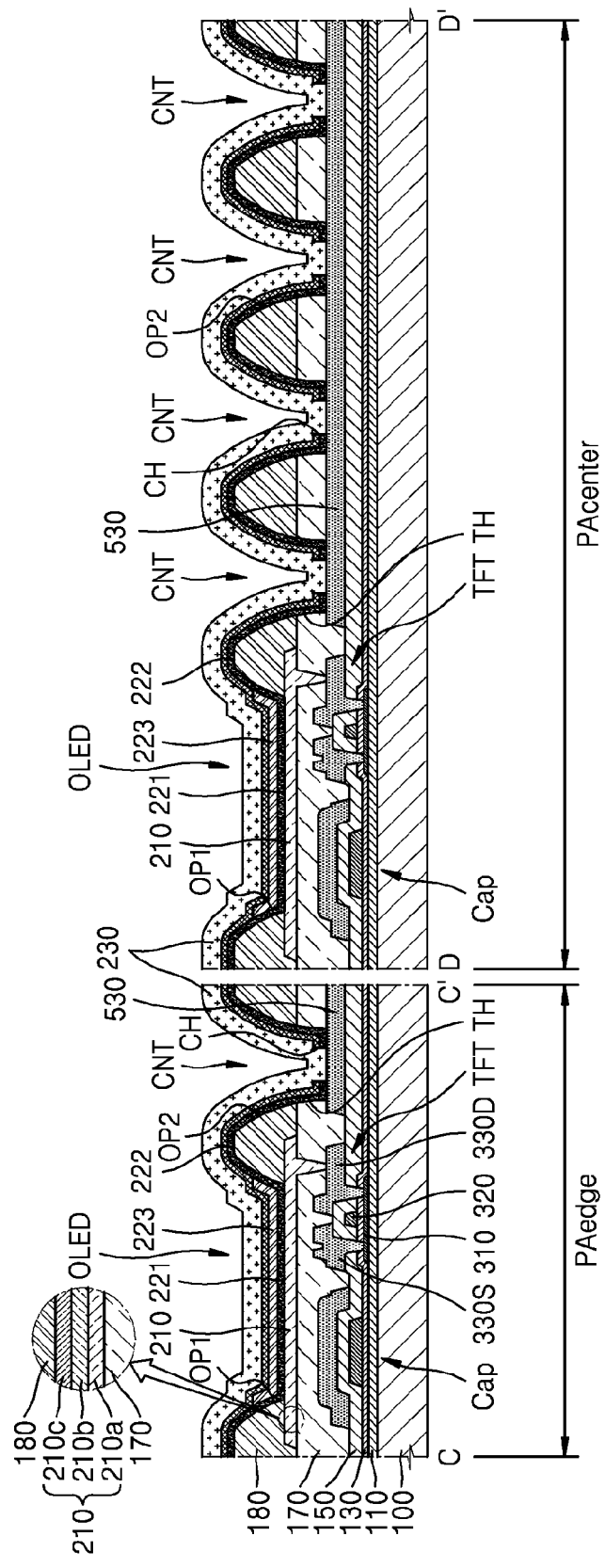
FIG. 9 is a cross-sectional view taken along lines C-C' and D-D' of FIG. 3B, illustrating a first pixel region and a second pixel region in an OLED display according to an exemplary embodiment.

FIG. 9 is a cross-sectional view taken along lines C-C' and D-D' of FIG. 3B, illustrating the first pixel region PAcenter and the second pixel region PAedge in an OLED display according to an exemplary embodiment.

Referring to FIG. 9, the OLED display may have the same structure as that of the OLED display described with reference to FIG. 8, except for the number of the contact holes CH and the number of the contact regions CNT formed according thereto.

Where the auxiliary line 530 and the opposite electrode 230 contact each other through the contact hole CH formed in the first and second intermediate layers 221 and 222, the contact region CNT is formed. The number of the contact holes CH in the first pixel region PAcenter may be greater than the number of the contact holes CH in the second pixel region PAedge. Accordingly, the total contact area in the first pixel region PAcenter may be larger than that in the second pixel region PAedge.

The auxiliary line 530 may be formed on the same layer as at least one electrode of the thin film transistor TFT. For example, the auxiliary lines 530 may be formed on the same layer as the source and drain electrodes 330S and 330D and formed of the same material as the source and drain electrode 330S and 330D. Since the source electrode 330S and the drain electrode 330D are covered by the planarization layer 170, the planarization layer 170 may include the through hole TH that is formed at a position corresponding to the second opening OP2 to expose the upper portion of the auxiliary line 530. The second opening OP2 and the through hole TH have substantially the same size. The contact hole CH is of equal or smaller size than each of the second opening OP2 and the through hole TH.

FIGS. 10A to 10D are cross-sectional views illustrating a manufacturing method according to an OLED display according to an exemplary embodiment, showing the first pixel region PAcenter and the second pixel region PAedge. The OLED display manufactured by the manufacturing method according to the present exemplary embodiment corresponds to the OLED display described with reference to FIG. 4.

Figure 10A:
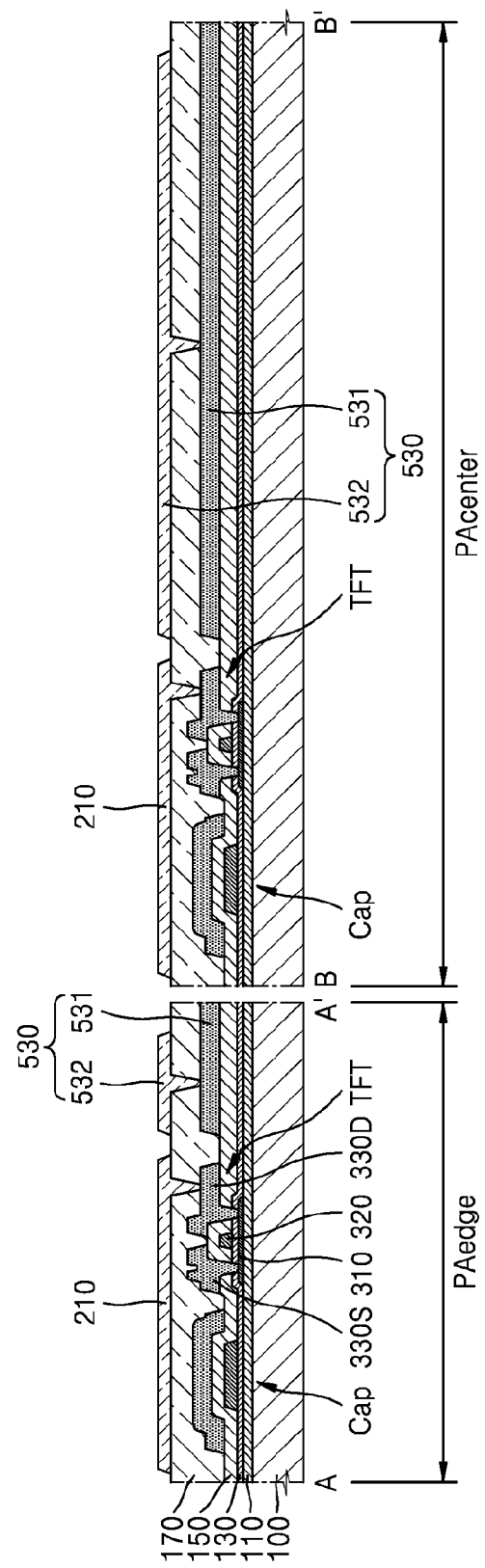
FIGS. 10A, 10B, 10C, and 10D are cross-sectional views illustrating a manufacturing method according to an OLED display according to an exemplary embodiment.

Referring to FIG. 10A, the pixel electrode 210 and the auxiliary line 530 are formed in each of the pixel regions PAedge and PAcenter located in the display region AA of the substrate 100. The pixel electrode 210 is electrically connected to one of the source electrode 330S and the drain electrode 330D of the thin film transistor TFT.

A variety of layers may be formed before the pixel electrode 210 and the auxiliary line 530 are formed. For example, the buffer layer 110 to prevent intrusion of impurities into the semiconductor layer 310 of the thin film transistor TFT, the gate insulating layer 130 to insulate the semiconductor layer 310 and the gate electrode 320 of the thin film transistor TFT, and the interlayer insulating layer 150 to insulate the source electrode 330S and/or the drain electrode 330D and the gate electrode 320 of the thin film transistor TFT may be formed on the substrate 100.

The auxiliary line 530 may include the first auxiliary line layer 531 formed on the same layer as the source and drain electrodes 330S and 330D and the second auxiliary line layer 532 formed on the same layer as the pixel electrode 210. The first auxiliary line layer 531 is formed during the process of manufacturing the source electrode 330S and the drain electrode 330D, and the second auxiliary line layer 532 is formed during the process of manufacturing the pixel electrode 210.

For example, a metal layer (not shown) may be formed on the interlayer insulating layer 150 and patterned such that the source electrode 330S and the drain electrode 330D of the thin film transistor TFT, and the first auxiliary line layer 531 are formed. Next, the planarization layer 170, including via holes exposing any one of the source electrode 330S and the drain electrode 330D, and a part of the first auxiliary line layer 531, is formed. Thereafter, a reflective electrode layer (not shown) is formed on the planarization layer 170 and patterned such that the pixel electrode 210 and the second auxiliary line layer 532 are formed. The first auxiliary line layer 531 is formed to extend in the first direction D1, as described above with reference to FIG. 2. In contrast, the second auxiliary line layer 532 may be patterned in an island form.

The storage capacitor Cap may include the lower electrode formed on the same layer as the gate electrode 320 and the upper electrode formed on the same layer as the source electrode 330S and the drain electrode 330D. The interlayer insulating layer 150 may determine capacitance of the storage capacitor Cap.

Figure 10B:
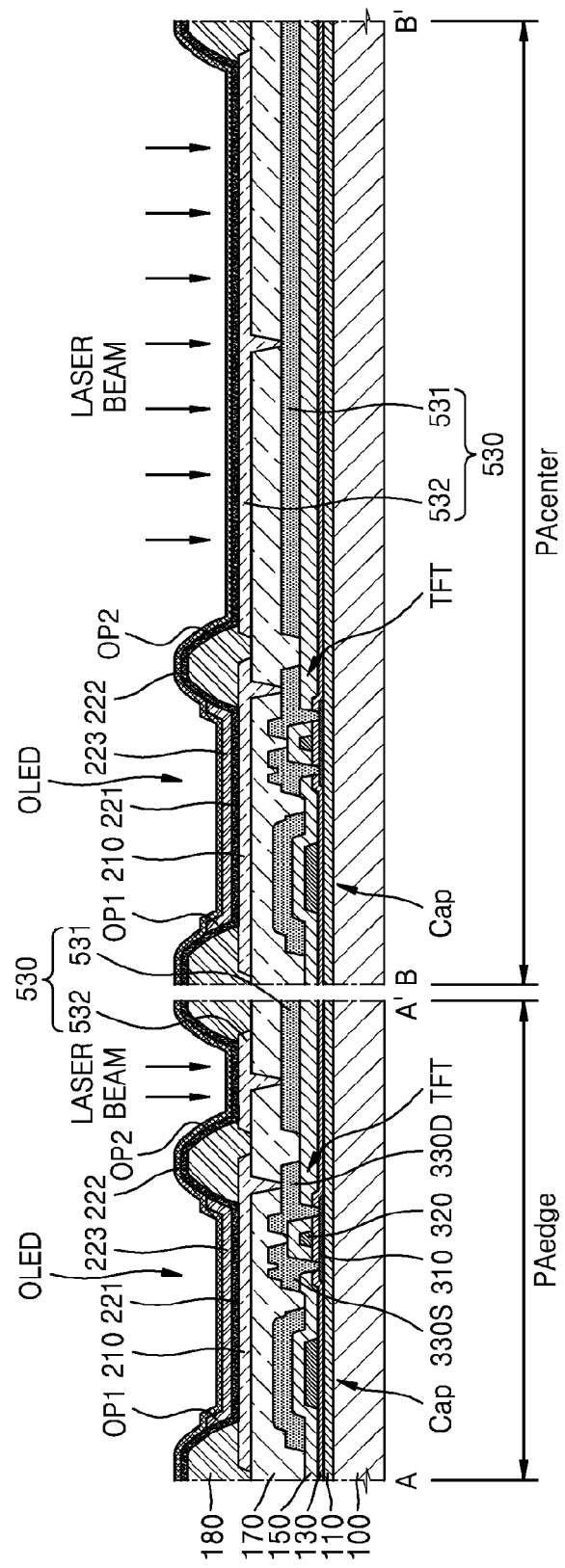

Referring to FIG. 10B, the pixel define layer 180 including the first opening OP1 exposing the upper portion of the pixel electrode 210 and the second opening OP2 exposing a part of the auxiliary line 530, for example, the upper portion of the second auxiliary line layer 532, is formed. Thereafter, the first intermediate layer 221 is formed on the upper portion of the pixel electrode 210 exposed through the first opening OP1, the upper surface of the pixel define layer 180 located between the pixel electrode 210 and the auxiliary line 530, and the auxiliary line 530. The first intermediate layer 221 may be the HTL. Alternatively, the first intermediate layer 221 may include the HIL and the HTL, but is not limited thereto and may include other layers.

The emission layer 223 is formed on the first intermediate layer 221 to be located in the first opening OP1, and the second intermediate layer 222 is formed on the first intermediate layer 221. The second intermediate layer 222 may include the ETL and/or the EIL. Although a process of forming the second intermediate layer 222 is included in the exemplary embodiment shown in FIG. 10A to 10D, exemplary embodiments of the present inventive concept are not limited thereto. For example, the second intermediate layer 222 may be omitted.

Figure 10C:
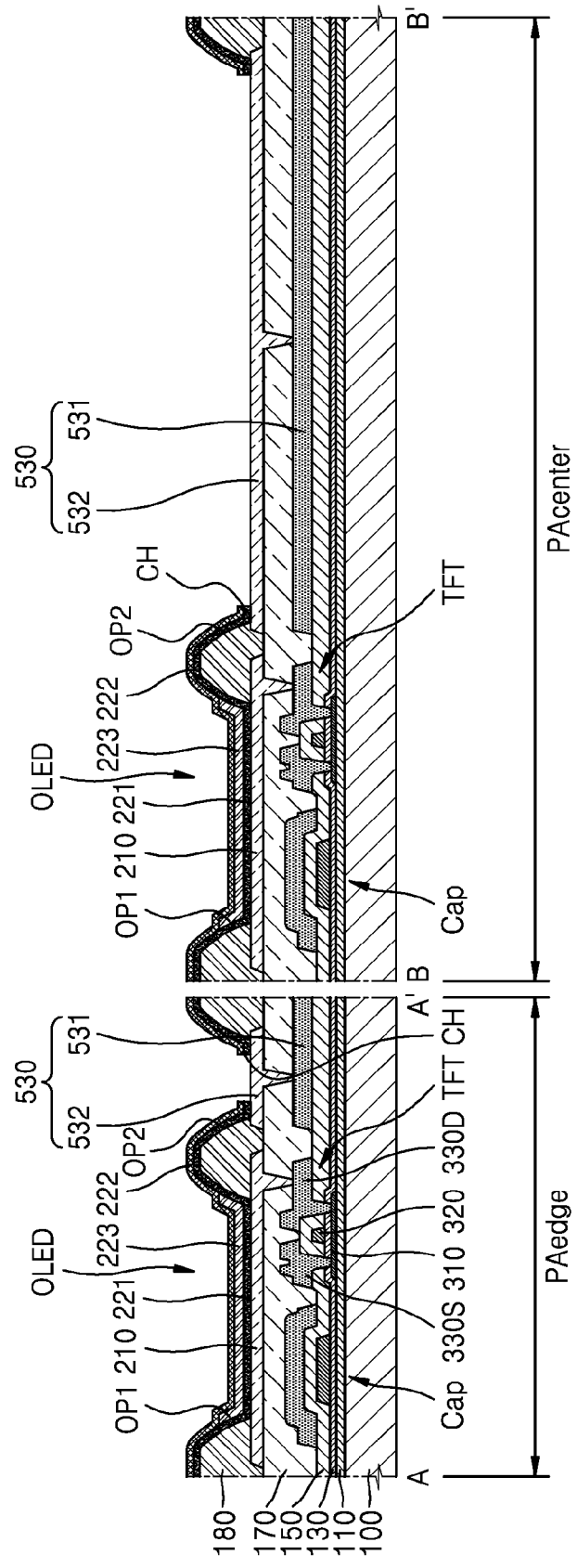

Referring to FIGS. 10B and 10C, a laser beam is radiated to remove sections of the first and second intermediate layers 221 and 222 formed in the second opening OP2 such that the contact hole CH is formed. Since the size of a laser beam determines the size of the contact hole CH, a size of a laser beam radiated in the first pixel region PAcenter may be larger than that of a laser beam radiated in the second pixel region. Accordingly, the size of the contact hole CH formed in the first pixel region PAcenter may be larger than that of the contact hole CH formed in the second pixel region PAedge.

Figure 10D:
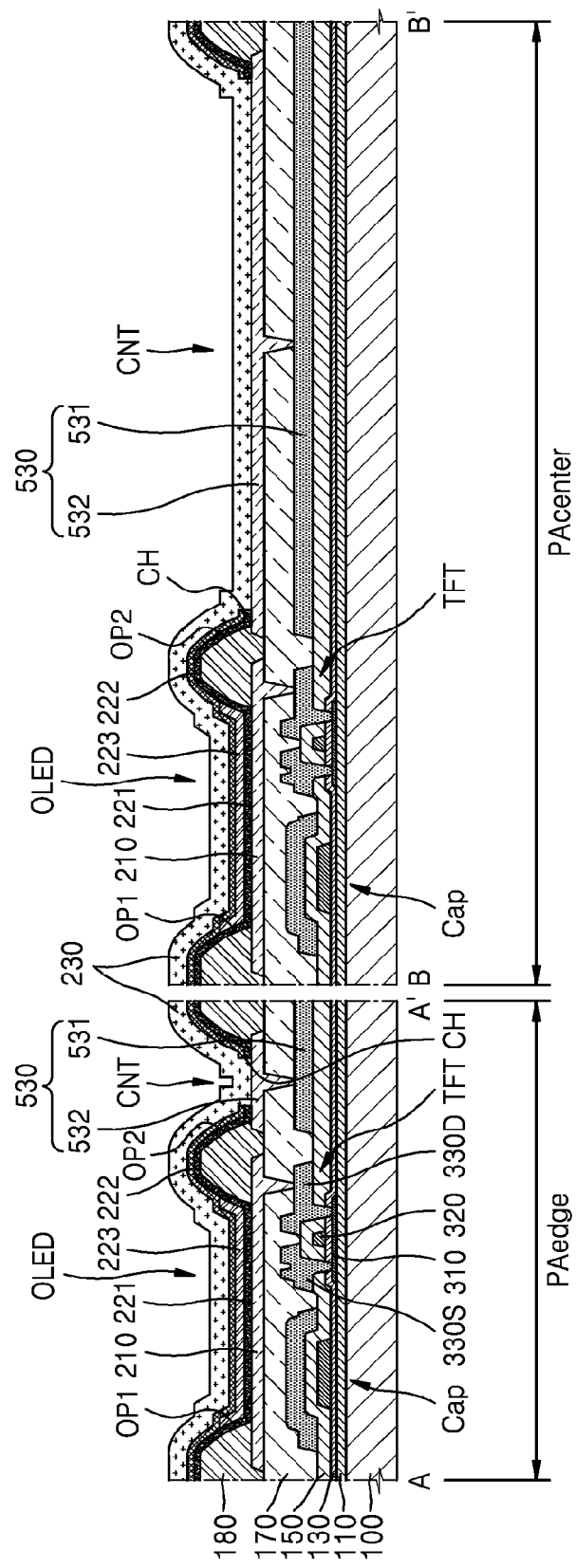

Referring to FIG. 10D, the opposite electrode 230 is formed in an area corresponding to the pixel electrode 210 and the auxiliary line 530. The opposite electrode 230 is integrally formed across the pixel regions and may cover the pixel regions. In this state, the opposite electrode 230 may directly contact the auxiliary line 530 exposed through the contact hole CH, for example, the second auxiliary line layer 532.

As described above, since the size of the contact hole CH of the first pixel region PAcenter is larger than that of the contact hole CH of the second pixel region PAedge, the total contact area between the auxiliary line 530 and the opposite electrode 230 in the first pixel region PAcenter is larger than the total contact area between the auxiliary line 530 and the opposite electrode 230 in the second pixel region PAedge.

According to the above-described manufacturing method, the total contact area between the auxiliary line 530 and the opposite electrode 230 may be different for the pixel regions. The total contact area between the auxiliary line 530 and the opposite electrode 230 may be determined by the size of the contact hole CH. As described above with reference to FIGS. 1 to 3A, by using the manufacturing method according to the present exemplary embodiment, the size of the contact hole CH may be gradually decreased such that the total contact area between the auxiliary line 530 and the opposite electrode 230 gradually decreases in a direction from the first pixel region PAcenter toward the second pixel region PAedge The contact hole CH for each pixel region may be formed symmetrically with respect to the imaginary bisector HL (see FIG. 2) that crosses the center portion AC of the display region AA.

FIGS. 11A to 11D are cross-sectional views illustrating a manufacturing method according to an OLED display according to an exemplary embodiment, showing the first pixel region PAcenter and the second pixel region PAedge. The OLED display manufactured according to the exemplary embodiment shown in FIGS. 11A to 11D corresponds to the OLED display described with reference to FIG. 5. The manufacturing method according to the present exemplary embodiment may be substantially the same as the manufacturing method described with reference to FIGS. 10A to 10D, except for the number of the contact holes CH.

Figure 11A:
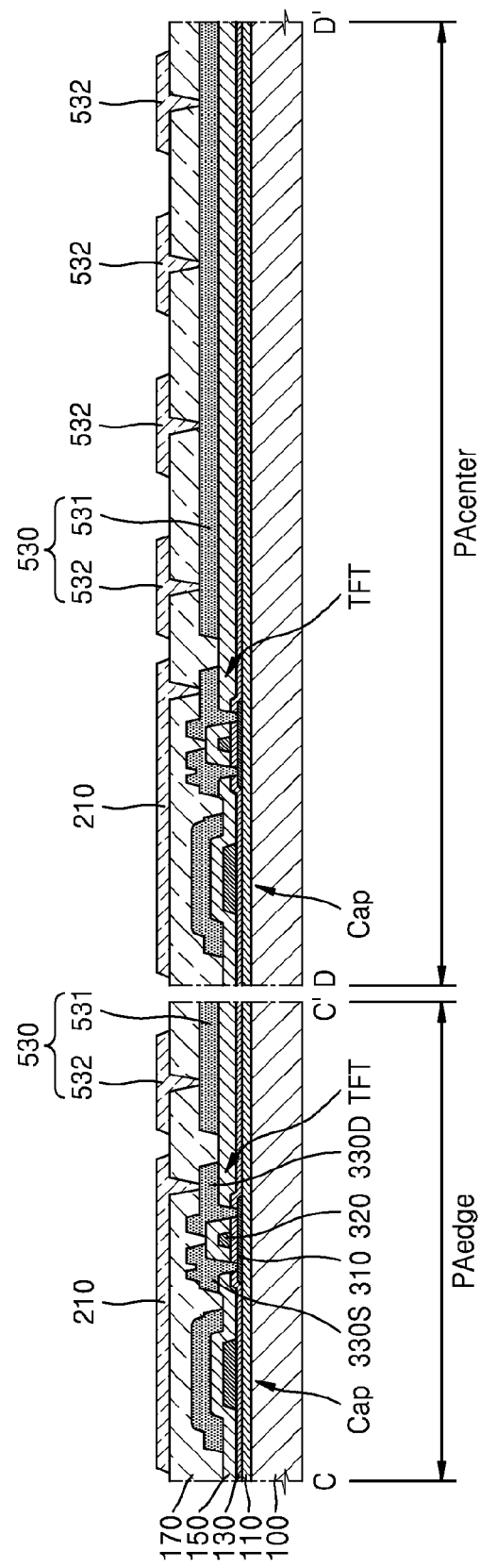
FIGS. 11A, 11B, 11C, and 11D are cross-sectional views illustrating a manufacturing method according to an OLED display according to an exemplary embodiment.

Referring to FIG. 11A, the pixel electrode 210 and the auxiliary line 530 are formed in each of the pixel regions PAedge and PAcenter located in the display region AA of the substrate 100. The auxiliary line 530 may include the first auxiliary line layer 531 formed on the same layer as the source electrode 330S and the drain electrode 330D and the second auxiliary line layer 532 formed on the same layer as the pixel electrode 210.

For example, a metal layer (not shown) may be formed on the interlayer insulating layer 150 and patterned such that the source electrode 330S and the drain electrode 330D of the thin film transistor TFT, and the first auxiliary line layer 531 are formed. Next, the planarization layer 170 including via holes exposing one of the source electrode 330S and the drain electrode 330D, and a part of the first auxiliary line layer 531, is formed. Thereafter, a reflective electrode layer (not shown) may be formed on the planarization layer 170 and patterned such that the pixel electrode 210 and the second auxiliary line layer 532 are formed. The first auxiliary line layer 531 is formed to extend in the first direction D1, as described above with reference to FIG. 2. In contrast, the second auxiliary line layer 532 may be patterned in an island form. In this state, a plurality of second auxiliary line layers 532 are formed to be separated from each other in the first pixel region PAcenter.

Figure 11B:
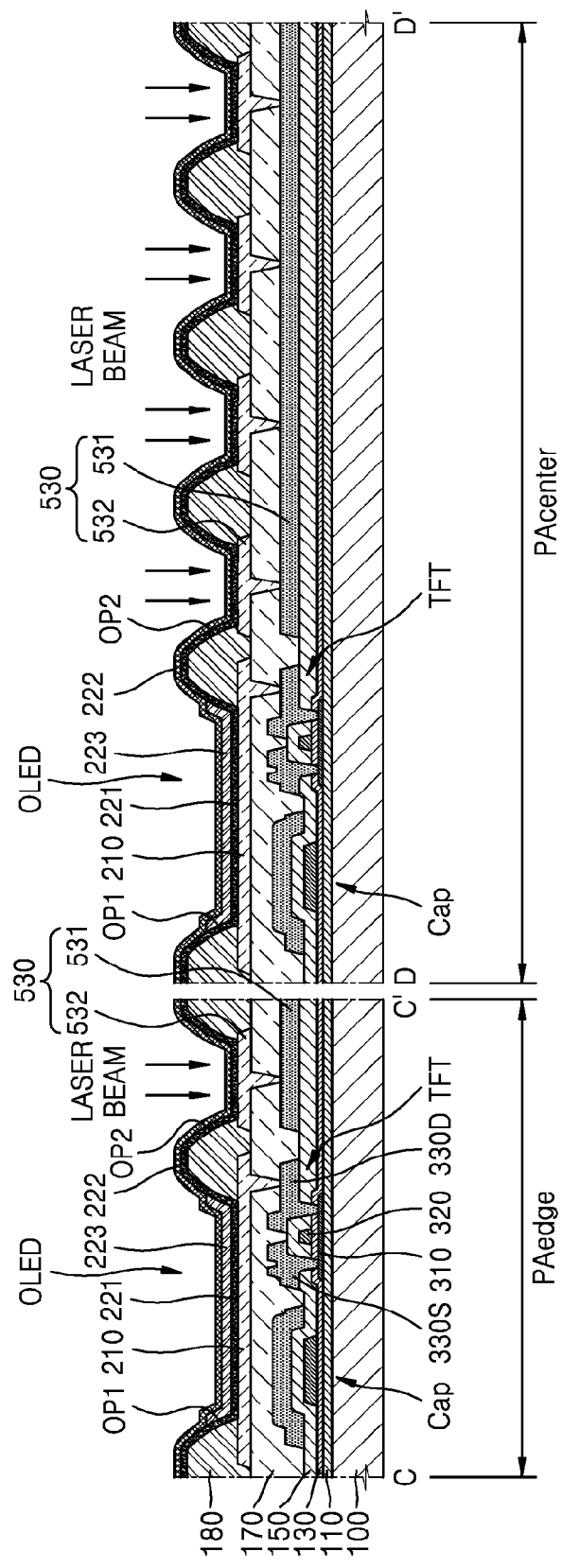

Referring to FIG. 11B, the pixel define layer 180 including the first opening OP1 exposing the upper portion of the pixel electrode 210 and the second opening OP2 exposing a part of the auxiliary line 530, for example, the upper portion of the second auxiliary line layer 532, is formed. The second opening OP2 of the pixel define layer 180 is formed in plurality to correspond to the second auxiliary line layers 532 provided in the first pixel region PAcenter.

Thereafter, the first intermediate layer 221 is formed on the upper portion of the pixel electrode 210 exposed through the first opening OP1, the upper surface of the pixel define layer 180 located between the pixel electrode 210 and the auxiliary line 530, and the auxiliary line 530. The emission layer 223 is formed on the first intermediate layer 221 to be located in the first opening OP1, and the second intermediate layer 222 is formed on the first intermediate layer 221. Although a process of forming the second intermediate layer 222 is included in the exemplary embodiment shown in FIGS. 11A to 11D, exemplary embodiments of the present inventive concept are not limited thereto. For example, the second intermediate layer 222 may be omitted.

Figure 11C:
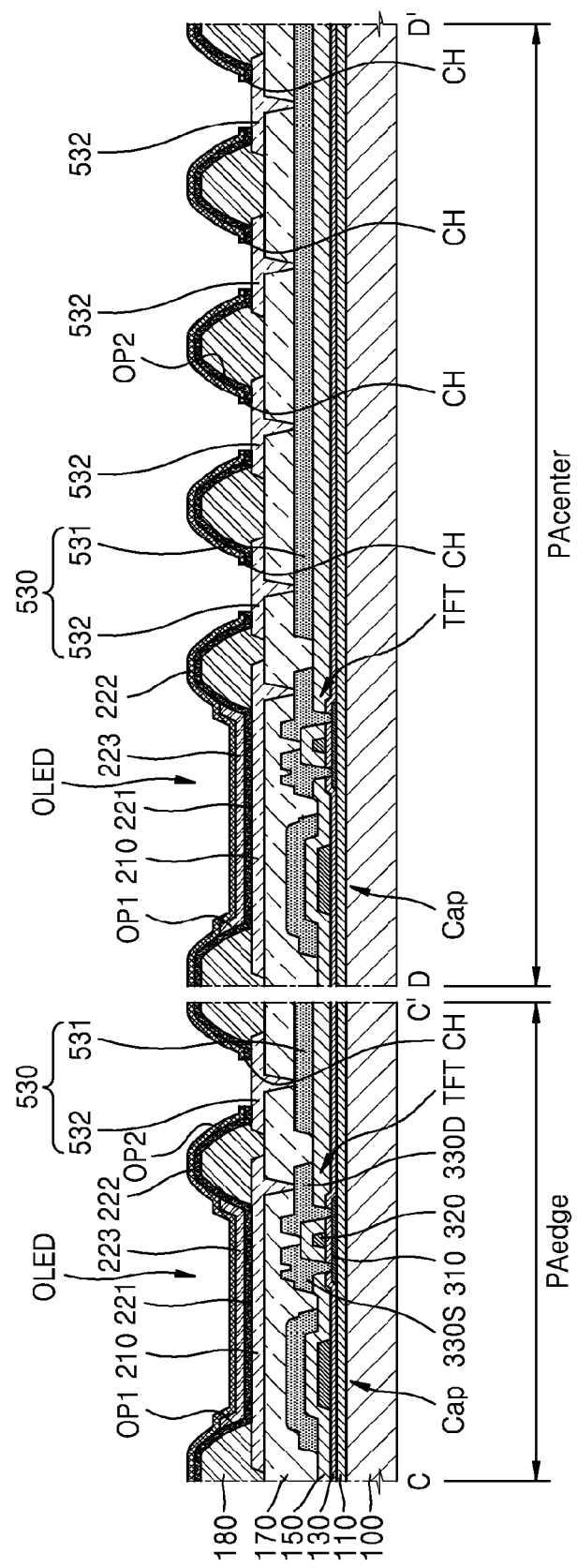

Referring to FIGS. 11B and 11C, a laser beam is radiated to remove sections of the first and second intermediate layers 221 and 222 formed in the second opening OP2 such that the contact hole CH is formed. The size of a laser beam radiated onto the first pixel region PAcenter and the size of a laser beam radiated onto the second pixel region PAedge may be identical to each other. However, since a laser beam is radiated onto a plurality of positions in the first pixel region PAcenter, the number of the contact holes CH formed in the first pixel region PAcenter may be greater than that of the contact holes CH formed in the second pixel region PAedge.

Figure 11D:
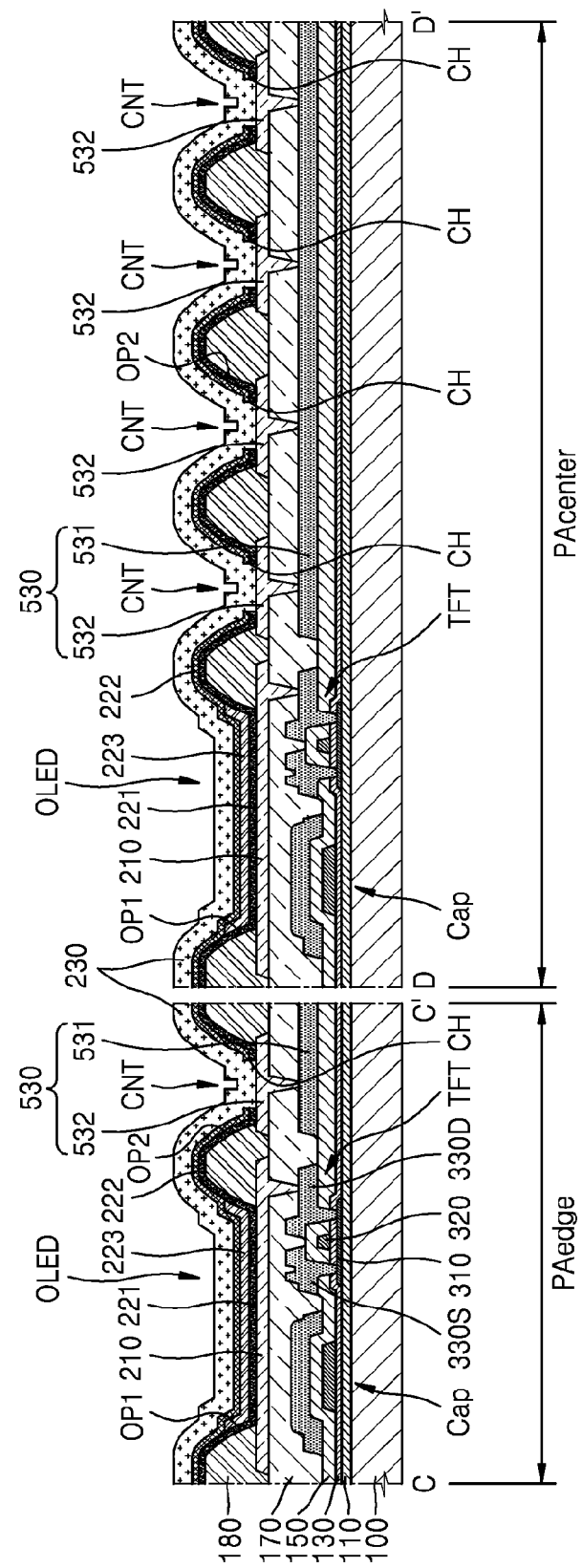

Referring to FIG. 11D, the opposite electrode 230 is formed in an area corresponding to the pixel electrode 210 and the auxiliary line 530. The opposite electrode 230 may directly contact the auxiliary line 530 exposed through the contact hole CH, for example, the second auxiliary line layer 532.

As described above, since the number of the contact holes CH in the first pixel region PAcenter is greater than that of the contact holes CH in the second pixel region PAedge, the total contact area between the auxiliary line 530 and the opposite electrode 230 in the first pixel region PAcenter is larger than the total contact area between the auxiliary line 530 and the opposite electrode 230 in the second pixel region PAedge.

According to the above-described manufacturing method, the total contact area between the auxiliary line 530 and the opposite electrode 230 may be different for each pixel region. The total contact area between the auxiliary line 530 and the opposite electrode 230 may be determined by the number of the contact holes CH. As described above with reference to FIGS. 1 to 3A, by using the manufacturing method according to the exemplary embodiment shown in FIGS. 11A to 1D, the number of the contact holes CH may be gradually decreased such that the total contact area between the auxiliary line 530 and the opposite electrode 230 gradually decreases from the first pixel region PAcenter toward the second pixel region PAedge. The contact hole CH for each pixel region may be formed symmetrically with respect to the imaginary bisector HL (see FIG. 2) that crosses the center portion AC of the display region AA.

FIGS. 12A to 12D are cross-sectional views illustrating a manufacturing method according to an OLED display according to an exemplary embodiment, showing the first pixel region PAcenter and the second pixel region PAedge. The OLED display manufactured by the manufacturing method according to the exemplary embodiment shown in FIGS. 12A to 12D corresponds to the OLED display described with reference to FIG. 6.

Figure 12A:
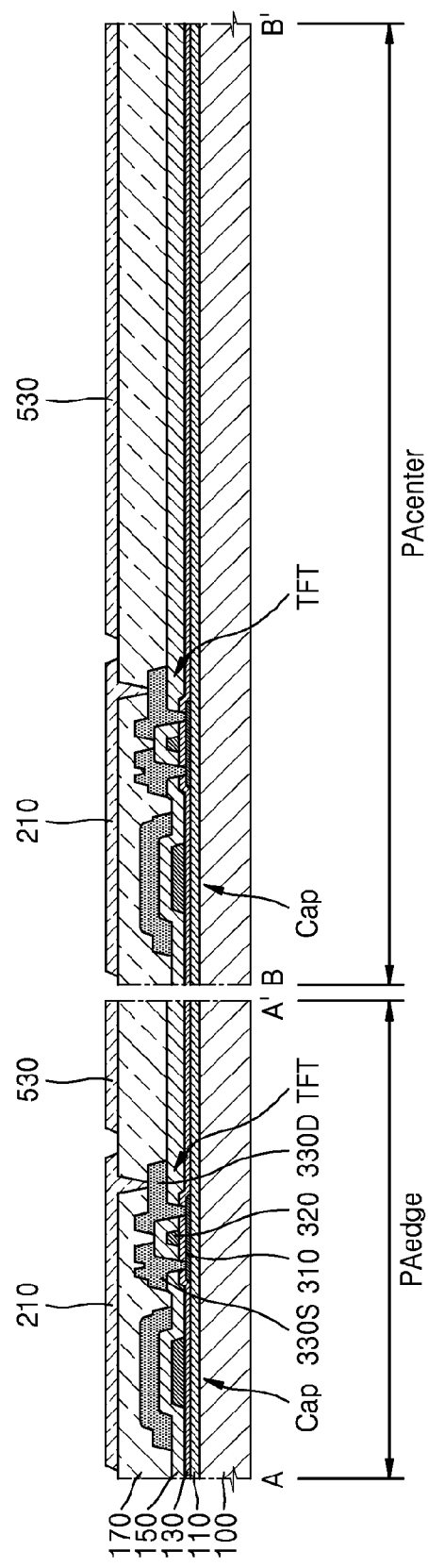
FIGS. 12A, 12B, 12C, and 12D are cross-sectional views illustrating a manufacturing method according to an OLED display according to an exemplary embodiment.

Referring to FIG. 12A, the pixel electrode 210 and the auxiliary line 530 are formed in each of the pixel regions PAedge and PAcenter located in the display region AA of the substrate 100. The pixel electrode 210 is electrically connected to one of the source electrode 330S and the drain electrode 330D of the thin film transistor TFT. The auxiliary line 530 may be formed on the same layer as the pixel electrode 210.

For example, a reflective electrode layer (not shown) may be formed on the planarization layer 170 and patterned such that the pixel electrode 210 and the auxiliary line 530 are formed. The auxiliary line 530 is formed to extend in the first direction D1, as described above with reference to FIG. 2.

Figure 12B:
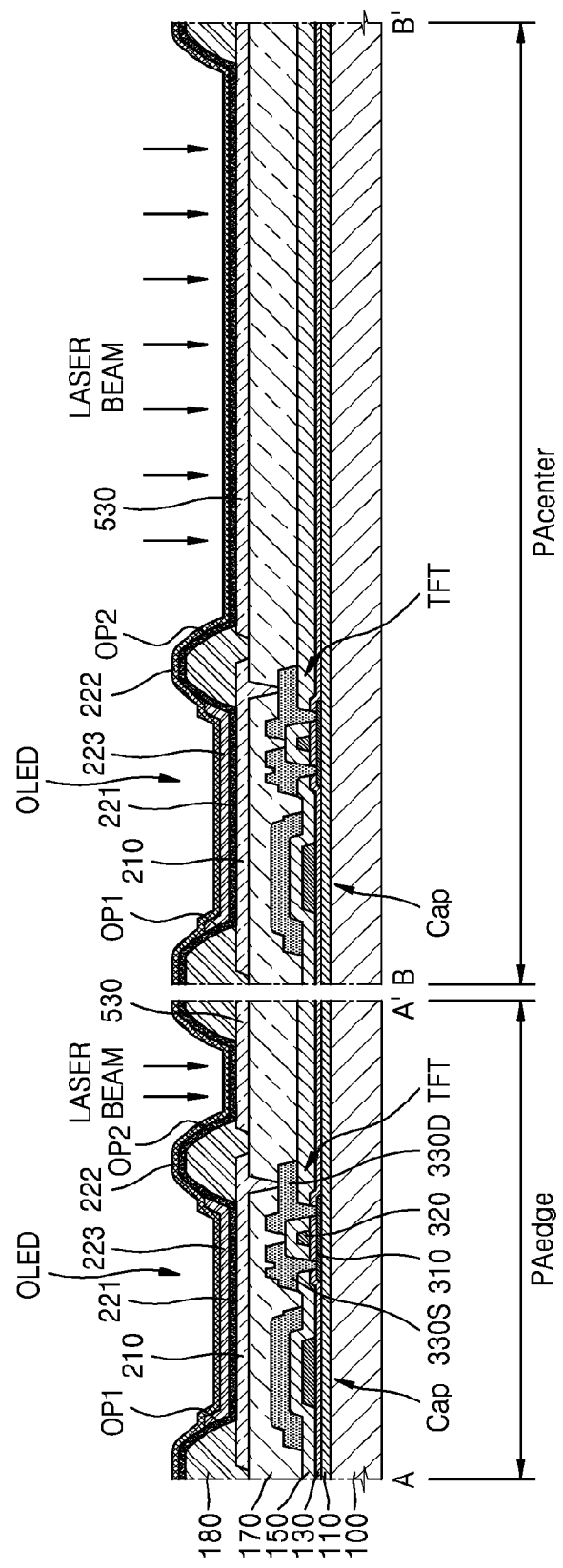

Referring to FIG. 12B, the pixel define layer 180 including the first opening OP1 exposing the upper portion of the pixel electrode 210 and the second opening OP2 exposing a part of the auxiliary line 530 is formed. Thereafter, the first intermediate layer 221 is formed on the upper portion of the pixel electrode 210 exposed through the first opening OP1, the upper surface of the pixel define layer 180 located between the pixel electrode 210 and the auxiliary line 530, and the auxiliary line 530.

The emission layer 223 is formed on the first intermediate layer 221 to be located in the first opening OP1, and the second intermediate layer 222 is formed on the first intermediate layer 221. Although a process of forming the second intermediate layer 222 is included in the exemplary embodiment shown in FIGS. 12A to 12D, exemplary embodiments of the present inventive concept are not limited thereto. For example, the second intermediate layer 222 may be omitted.

Figure 12C:
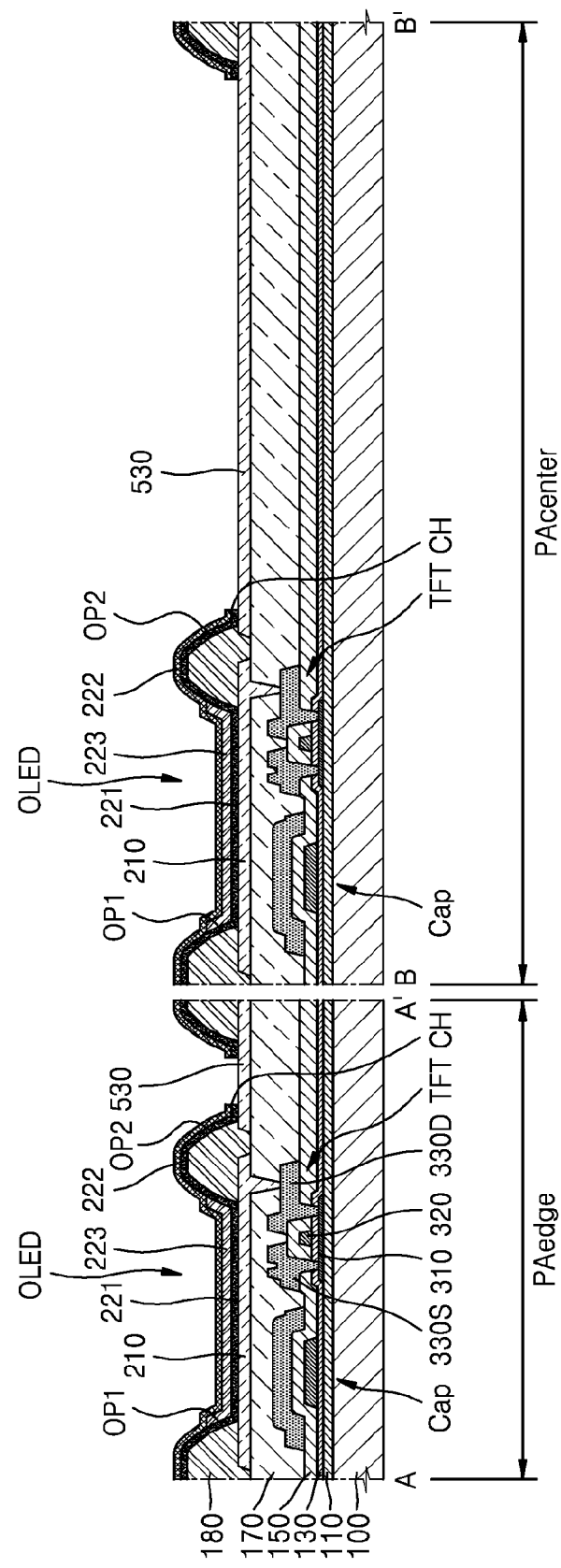

Referring to FIGS. 12B and 12C, a laser beam is radiated to remove the first and second intermediate layers 221 and 222 formed in the second opening OP2 such that the contact hole CH is formed. Since the size of a laser beam determines the size of the contact hole CH, a laser beam larger than a laser beam irradiated onto the second pixel region PAedge is used for the first pixel region PAcenter. Accordingly, the size of the contact hole CH formed in the first pixel region PAcenter is larger than that of the contact hole CH formed in the second pixel region PAedge.

Figure 12D:
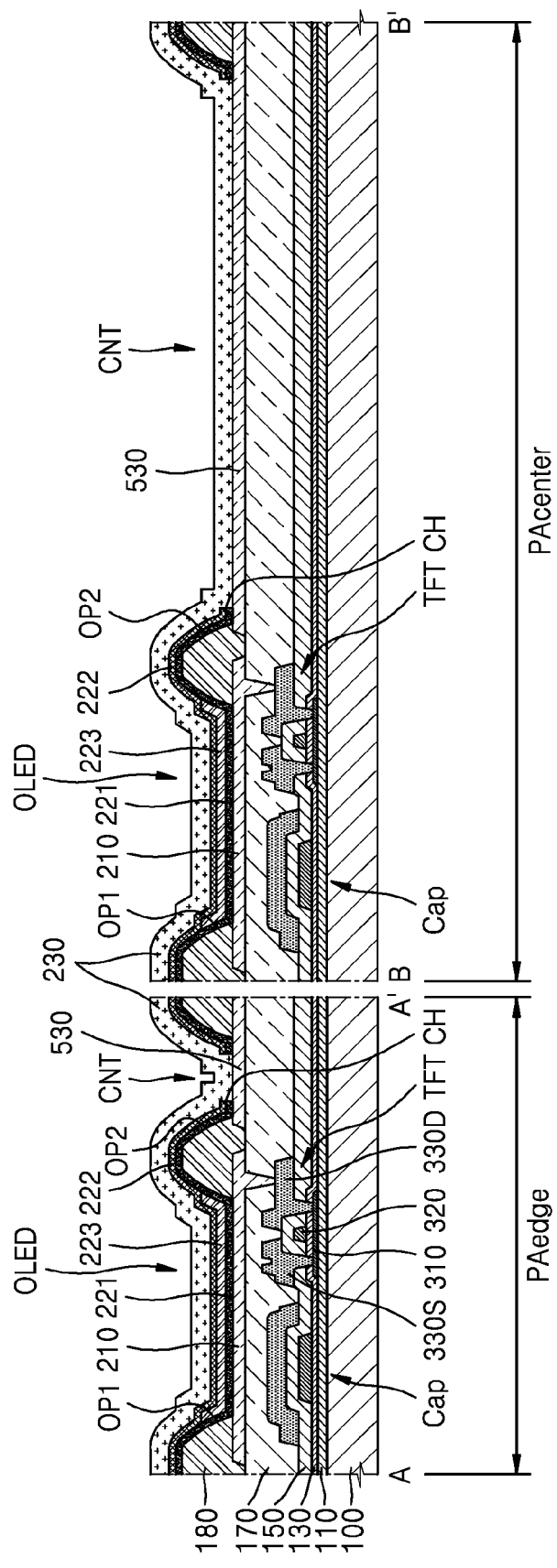

Referring to FIG. 12D, the opposite electrode 230 is formed in an area corresponding to the pixel electrode 210 and the auxiliary line 530. The opposite electrode 230 may directly contact the auxiliary line 530 exposed through the contact hole CH.

As described above, since the size of the contact hole CH of the first pixel region PAcenter is larger than that of the contact hole CH of the second pixel region PAedge, the total contact area between the auxiliary line 530 and the opposite electrode 230 in the first pixel region PAcenter is larger than the total contact area between the auxiliary line 530 and the opposite electrode 230 in the second pixel region PAedge.

According to the above-described manufacturing method shown in FIGS. 12A to 12D, the total contact area between the auxiliary line 530 and the opposite electrode 230 may be different for each pixel region. The total contact area between the auxiliary line 530 and the opposite electrode 230 may be determined by the size of the contact hole CH. As described above with reference to FIGS. 1 to 3A, by using the manufacturing method according to the exemplary embodiment, the size of the contact hole CH may be gradually decreased such that the total contact area between the auxiliary line 530 and the opposite electrode 230 gradually decreases from the first pixel region PAcenter toward the second pixel region PAedge. The contact hole CH for each pixel region may be formed symmetrically with respect to the imaginary bisector HL (see FIG. 2) that crosses the center portion AC of the display region AA.

FIGS. 13A to 13D are cross-sectional views illustrating a manufacturing method according to an OLED display according to an exemplary embodiment, showing the first pixel region PAcenter and the second pixel region PAedge. The OLED display manufactured according to the exemplary embodiment shown in FIGS. 13A to 13D corresponds to the OLED display described with reference to FIG. 7. The manufacturing method according to the exemplary embodiment shown in FIGS. 13A to 13D may be substantially the same as the manufacturing method described with reference to FIGS. 12A to 12D, except for the number of the contact holes CH.

Figure 13A:
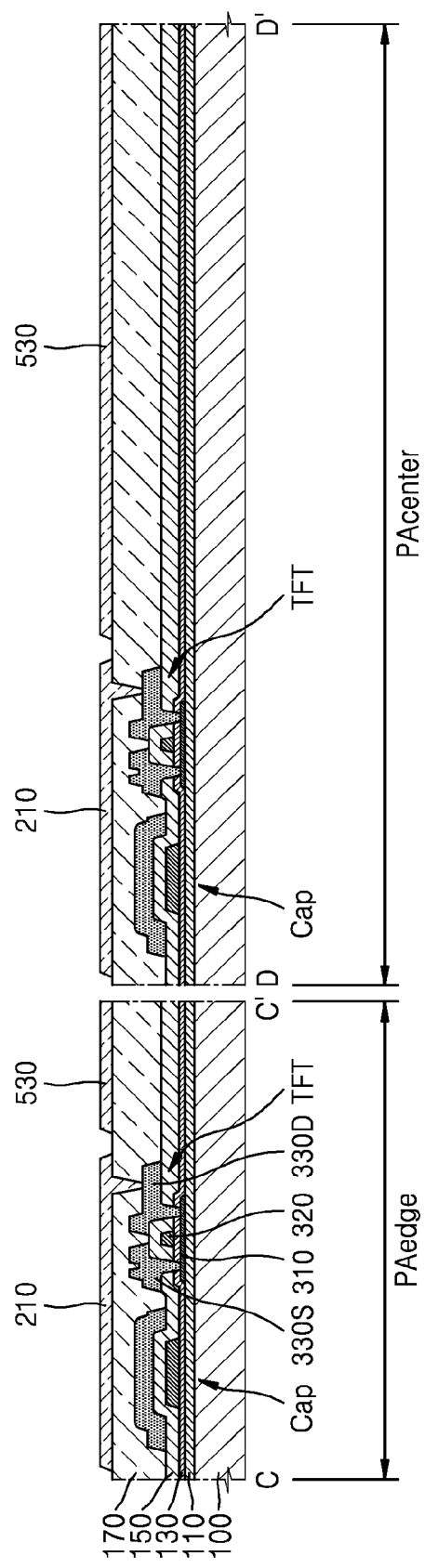
FIGS. 13A, 13B, 13C and 13D are cross-sectional views illustrating a manufacturing method according to an OLED display according to an exemplary embodiment.

Referring to FIG. 13A, the pixel electrode 210 and the auxiliary line 530 are formed in each of the pixel regions PAedge and PAcenter located in the display region AA of the substrate 100. The pixel electrode 210 is electrically connected to one of the source electrode 330S and the drain electrode 330D of the thin film transistor TFT. The auxiliary line 530 may be formed on the same layer as the pixel electrode 210.

A reflective electrode layer (not shown) may be formed on the planarization layer 170 and patterned such that the pixel electrode 210 and the auxiliary line 530 are formed. The auxiliary line 530 is formed to extend in the first direction D1, as described above with reference to FIG. 2.

Figure 13B:
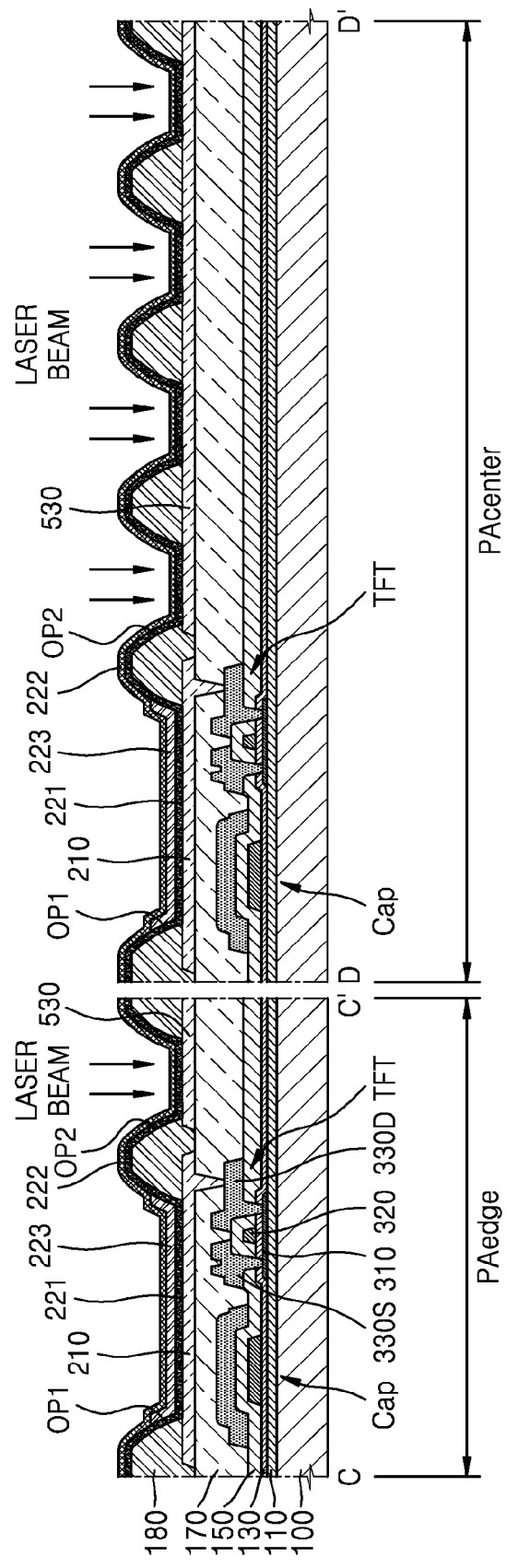

Referring to FIG. 13B, the pixel define layer 180 including the first opening OP1 exposing the upper portion of the pixel electrode 210 and the second opening OP2 exposing a part of the auxiliary line 530 is formed. The second opening OP2 is formed in plurality in the first pixel region PAcenter.

Thereafter, the first intermediate layer 221 is formed on the upper portion of the pixel electrode 210 exposed through the first opening OP1, the upper surface of the pixel define layer 180 located between the pixel electrode 210 and the auxiliary line 530, and the auxiliary line 530. The emission layer 223 is formed on the first intermediate layer 221 to be located in the first opening OP1, and the second intermediate layer 222 is formed on the first intermediate layer 221. Although a process of forming the second intermediate layer 222 is included in the exemplary embodiment shown in FIGS. 13A to 13D, exemplary embodiments of the present inventive concept are not limited thereto. For example, the second intermediate layer 222 may be omitted.

Figure 13C:
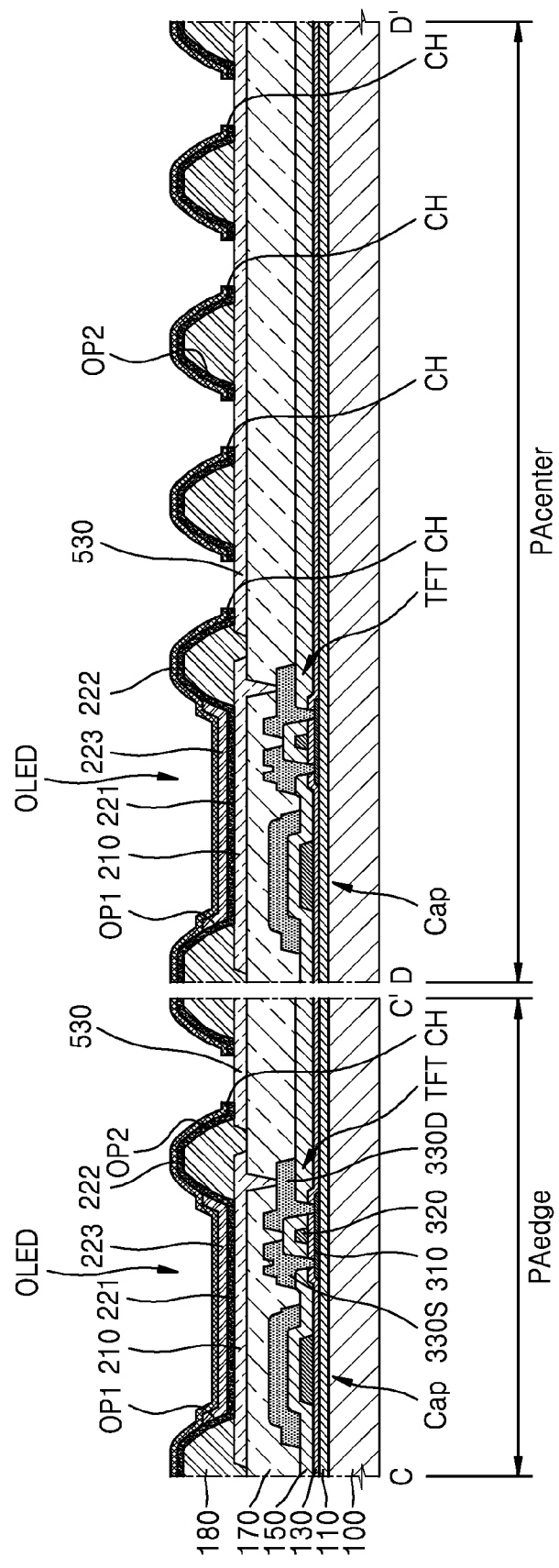

Referring to FIGS. 13B and 13C, a laser beam is radiated to remove sections of the first and second intermediate layers 221 and 222 formed in the second opening OP2 such that the contact hole CH is formed. The size of a laser beam irradiated onto the first pixel region PAcenter and the size of a laser beam irradiated onto the second pixel region PAedge may be identical to each other. However, since a laser beam is irradiated onto a plurality of positions in the first pixel region PAcenter, the number of the contact holes CH formed in the first pixel region PAcenter is greater than that of the contact holes CH formed in the second pixel region PAedge.

Figure 13D:
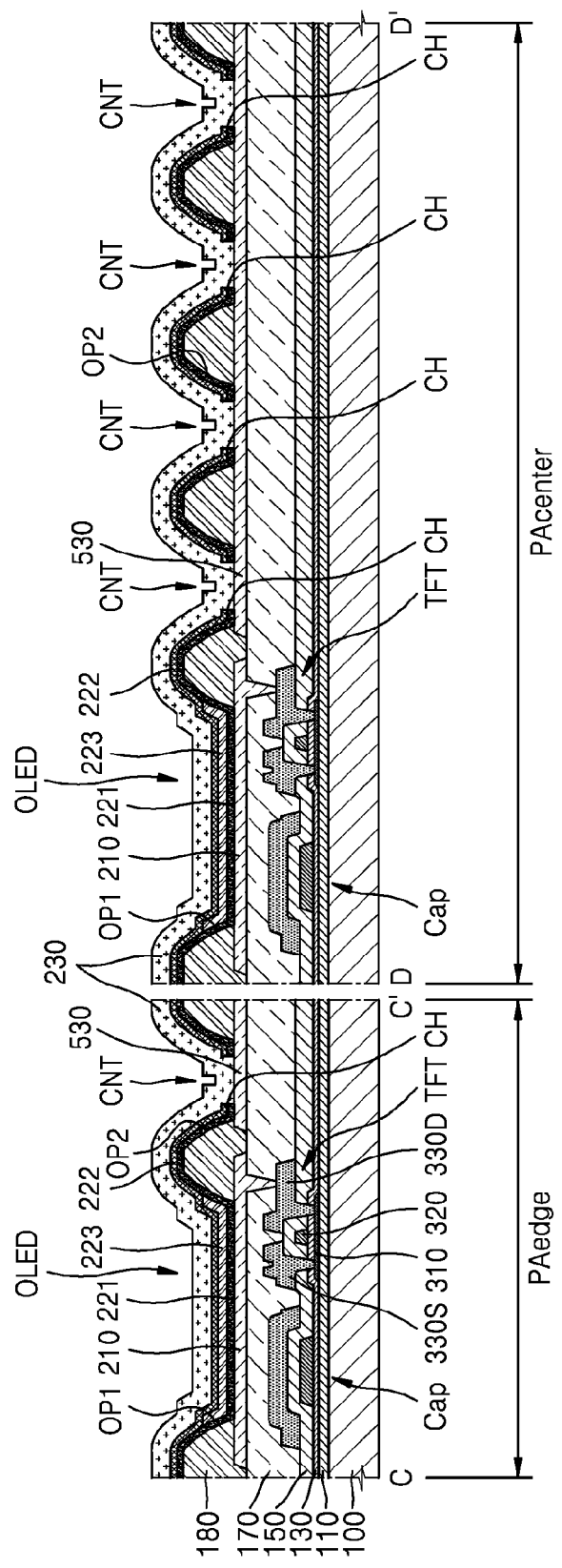

Referring to FIG. 13D, the opposite electrode 230 is formed in an area corresponding to the pixel electrode 210 and the auxiliary line 530. The opposite electrode 230 may directly contact the auxiliary line 530 exposed through the contact hole CH.

As described above, since the number of the contact holes CH in the first pixel region PAcenter is greater than that of the contact holes CH in the second pixel region PAedge, the total contact area between the auxiliary line 530 and the opposite electrode 230 in the first pixel region PAcenter is larger than the total contact area between the auxiliary line 530 and the opposite electrode 230 in the second pixel region PAedge.

The total contact area between the auxiliary line 530 and the opposite electrode 230 may be different for each pixel region according to the above-described manufacturing method. The total contact area between the auxiliary line 530 and the opposite electrode 230 may be determined by the number of the contact holes CH. As described above with reference to FIGS. 1 to 3A, by using the manufacturing method according to the present exemplary embodiment, the number of the contact holes CH may be gradually decreased such that the total contact area between the auxiliary line 530 and the opposite electrode 230 gradually decreases from the first pixel region PAcenter toward the second pixel region PAedge. The contact hole CH for each pixel region may be formed symmetrically with respect to the imaginary bisector HL (see FIG. 2) that crosses the center portion AC of the display region AA.

FIGS. 14A to 14D are cross-sectional views illustrating a manufacturing method according to an OLED display according to an exemplary embodiment, showing the first pixel region PAcenter and the second pixel region PAedge. The OLED display manufactured by the manufacturing method according to the exemplary embodiment shown in FIGS. 14A to 14D corresponds to the OLED display described with reference to FIG. 8.

Figure 14A:
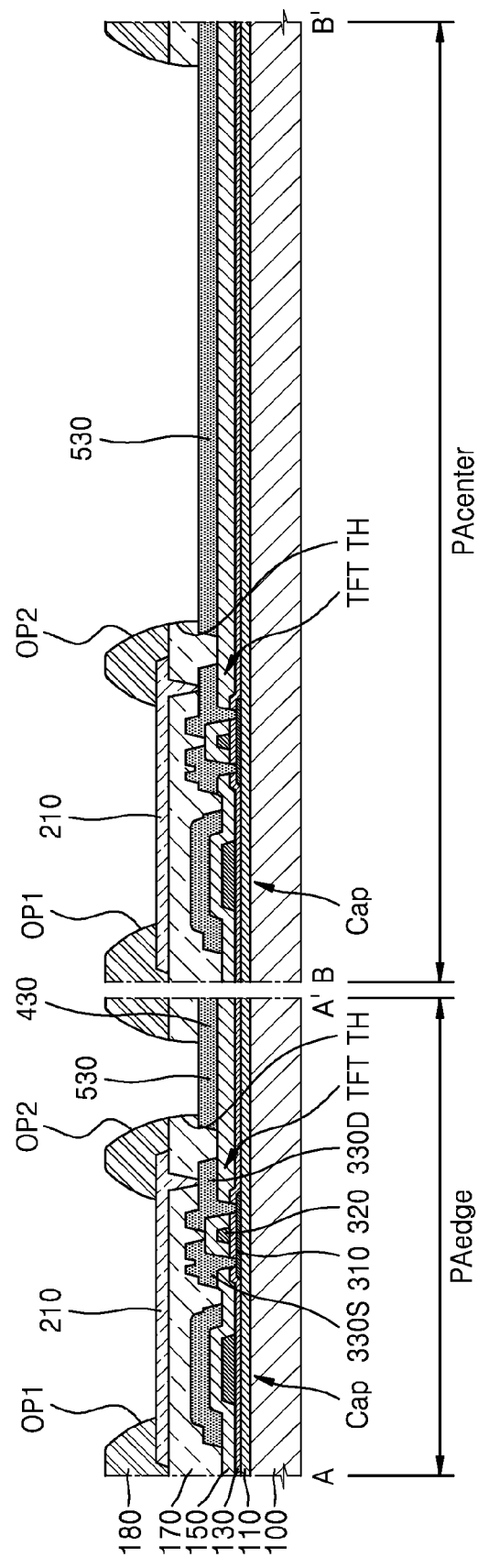
FIGS. 14A, 14B, 14C, and 14D are cross-sectional views illustrating a manufacturing method according to an OLED display according to an exemplary embodiment.

Referring to FIG. 14A, the pixel electrode 210 and the auxiliary line 530 are formed in each of the pixel regions PAedge and PAcenter located in the display region AA of the substrate 100. The pixel electrode 210 is electrically connected to any one of the source electrode 330S and the drain electrode 330D of the thin film transistor TFT. The auxiliary line 530 may be formed on the same layer as the source electrode 330S and the drain electrode 330D.

For example, a metal layer (not shown) may be formed on the interlayer insulating layer 150 and patterned such that the source electrode 330S and the drain electrode 330D of the thin film transistor TFT, and the auxiliary line 530 are formed. Thereafter, the planarization layer 170 is formed and a reflective electrode layer (not shown) may be formed on the planarization layer 170, and then, the pixel electrode 210 may be formed by patterning the reflective electrode layer.

Next, the pixel define layer 180 including the first opening OP1 exposing the upper portion of the pixel electrode 210 and the second opening OP2 located at a position corresponding to a part of the auxiliary line 530 is formed.

When the second opening OP2 of the pixel define layer 180 is formed, the planarization layer 170 located under the second opening OP2 of the pixel electrode layer 180 is patterned together, thereby forming the through hole TH at a position corresponding to the second opening OP2. Since the second opening OP2 and the through hole TH are patterned in the same process, the second opening OP2 and the through hole TH may have substantially the same size.

Figure 14B:
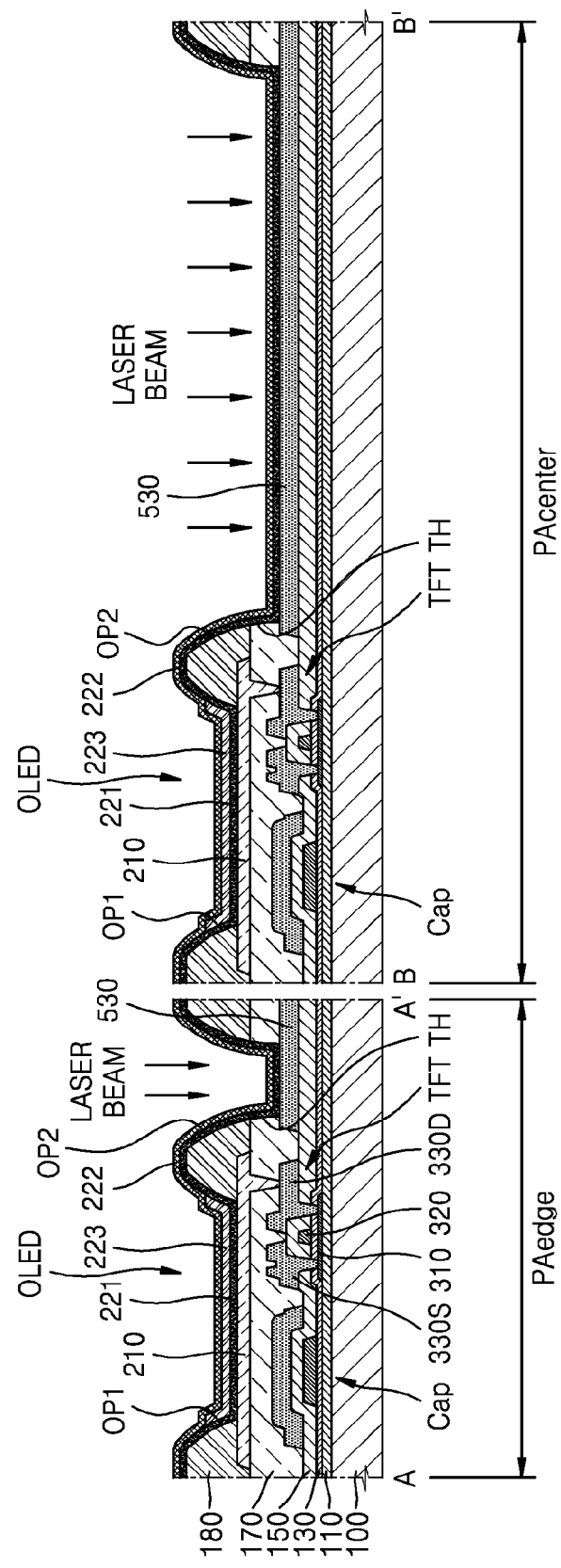

Referring to FIG. 14B, the first intermediate layer 221 is formed on the upper portion of the pixel electrode 210 exposed through the first opening OP1, the upper surface of the pixel define layer 180 located between the pixel electrode 210, and the auxiliary line 530 exposed through the through hole TH. The emission layer 223 is formed on the first intermediate layer 221 to be located in the first opening OP1, and the second intermediate layer 222 is formed on the first intermediate layer 221. Although a process of forming the second intermediate layer 222 is included in the exemplary embodiment shown in FIGS. 14A to 14D, exemplary embodiments of the present inventive concept are not limited thereto. For example, the second intermediate layer 222 may be omitted.

Figure 14C:
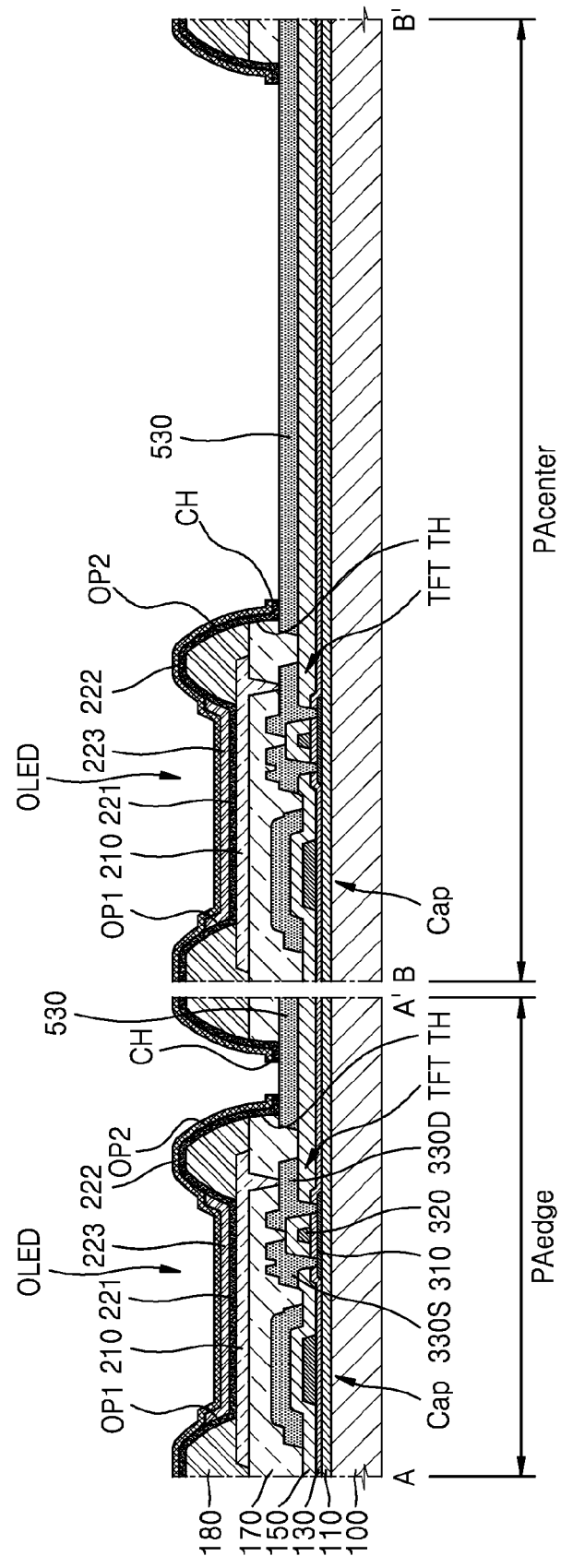

Referring to FIGS. 14B and 14C, a laser beam is radiated to remove sections of the first and second intermediate layers 221 and 222 formed in the second opening OP2 such that the contact hole CH is formed. A laser beam larger than a laser beam irradiated onto the second pixel region PAedge is used for the first pixel region PAcenter. Accordingly, the size of the contact hole CH formed in the first pixel region PAcenter is larger than that of the contact hole CH formed in the second pixel region PAedge.

Figure 14D:
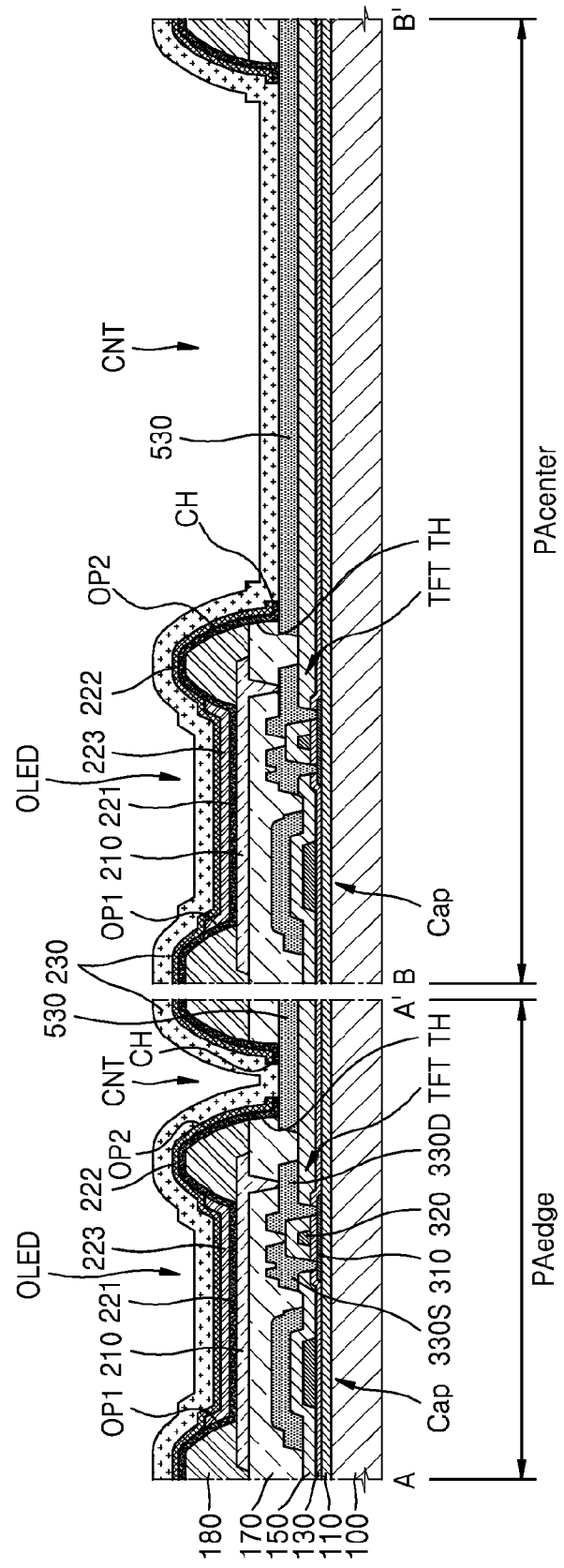

Referring to FIG. 14D, the opposite electrode 230 is formed in an area corresponding to the pixel electrode 210 and the auxiliary line 530. The opposite electrode 230 may directly contact the auxiliary line 530 exposed through the contact hole CH.

As described above, since the size of the contact hole CH of the first pixel region PAcenter is larger than that of the contact hole CH of the second pixel region PAedge, the total contact area between the auxiliary line 530 and the opposite electrode 230 in the first pixel region PAcenter is larger than the total contact area between the auxiliary line 530 and the opposite electrode 230 in the second pixel region PAedge.

According to the above-described manufacturing method, the total contact area between the auxiliary line 530 and the opposite electrode 230 may be different for each pixel region. The total contact area between the auxiliary line 530 and the opposite electrode 230 may be determined by the size of the contact hole CH. As described above with reference to FIGS. 1 to 3A, by using the manufacturing method according to the present exemplary embodiment, the size of the contact hole CH may be gradually decreased such that the total contact area between the auxiliary line 530 and the opposite electrode 230 gradually decreases from the first pixel region PAcenter toward the second pixel region PAedge. The contact hole CH for each pixel region may be formed symmetrically with respect to the imaginary bisector HL (see FIG. 2) that crosses the center portion AC of the display region AA.

FIGS. 15A to 15D are cross-sectional views illustrating a manufacturing method according to an OLED display according to an exemplary embodiment, showing the first pixel region PAcenter and the second pixel region PAedge. The OLED display manufactured by the manufacturing method according to the exemplary embodiment shown in FIGS. 15A to 15D corresponds to the OLED display described with reference to FIG. 9. The manufacturing method according to the exemplary embodiment shown in FIGS. 15A to 15D may be substantially the same as the manufacturing method described with reference to FIGS. 14A to 14D, except for the number of the contact holes CH.

Figure 15A:
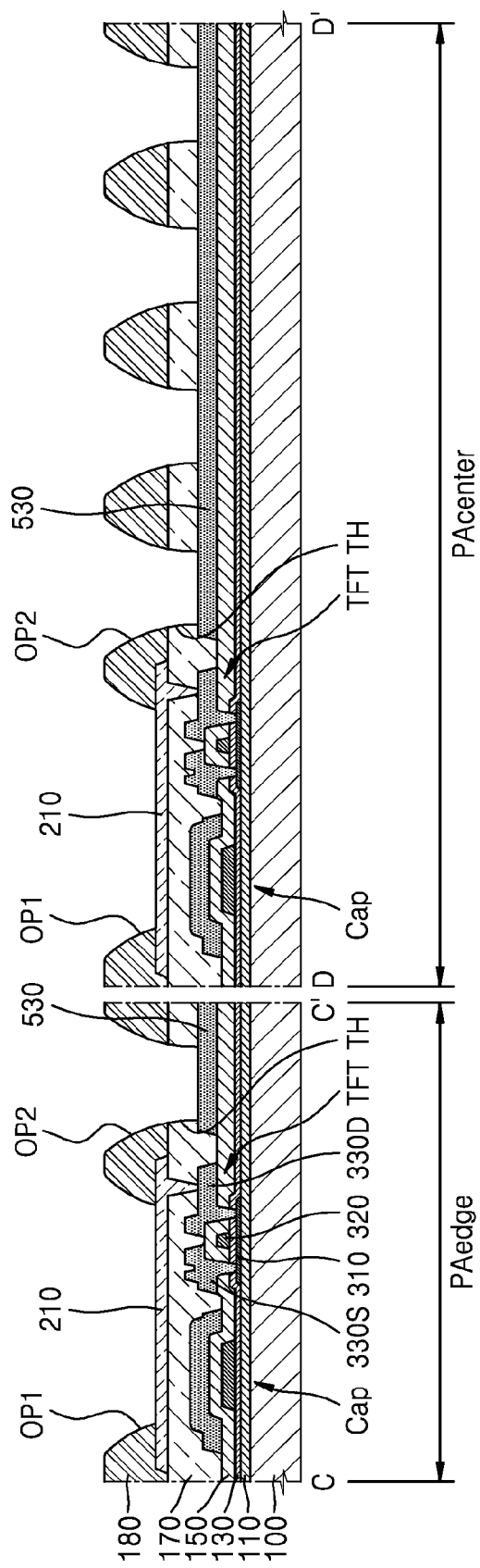
FIGS. 15A, 15B, 15C, and 15D are cross-sectional views illustrating a manufacturing method according to an OLED display according to an exemplary embodiment.

Referring to FIG. 15A, the pixel electrode 210 and the auxiliary line 530 are formed in each of the pixel regions PAedge and PAcenter located in the display region AA of the substrate 100.

For example, a metal layer (not shown) may be formed on the interlayer insulating layer 150 and patterned such that the source electrode 330S and the drain electrode 330D of the thin film transistor TFT, and the auxiliary line 530, are formed. Thereafter, the planarization layer 170 is formed and a reflective electrode layer (not shown) may be formed on the planarization layer 170, and then, the pixel electrode 210 may be formed by patterning the reflective electrode layer.

Next, the pixel define layer 180 including the first opening OP1 exposing the upper portion of the pixel electrode 210 and the second opening OP2 disposed at a position corresponding to a part of the auxiliary line 530 may be formed by coating an insulating layer (not shown) and patterning the insulating layer. In this state, the second opening OP2 may be formed in plurality in the auxiliary line 530.

When the second opening OP2 of the pixel define layer 180 is formed, the planarization layer 170 located under the second opening OP2 of the pixel electrode layer 180 is patterned during the same process, thereby forming the through hole TH at a position corresponding to the second opening OP2. Since the second opening OP2 and the through hole TH are patterned in the same process, the second opening OP2 and the through hole TH may have substantially the same size.

Figure 15B:
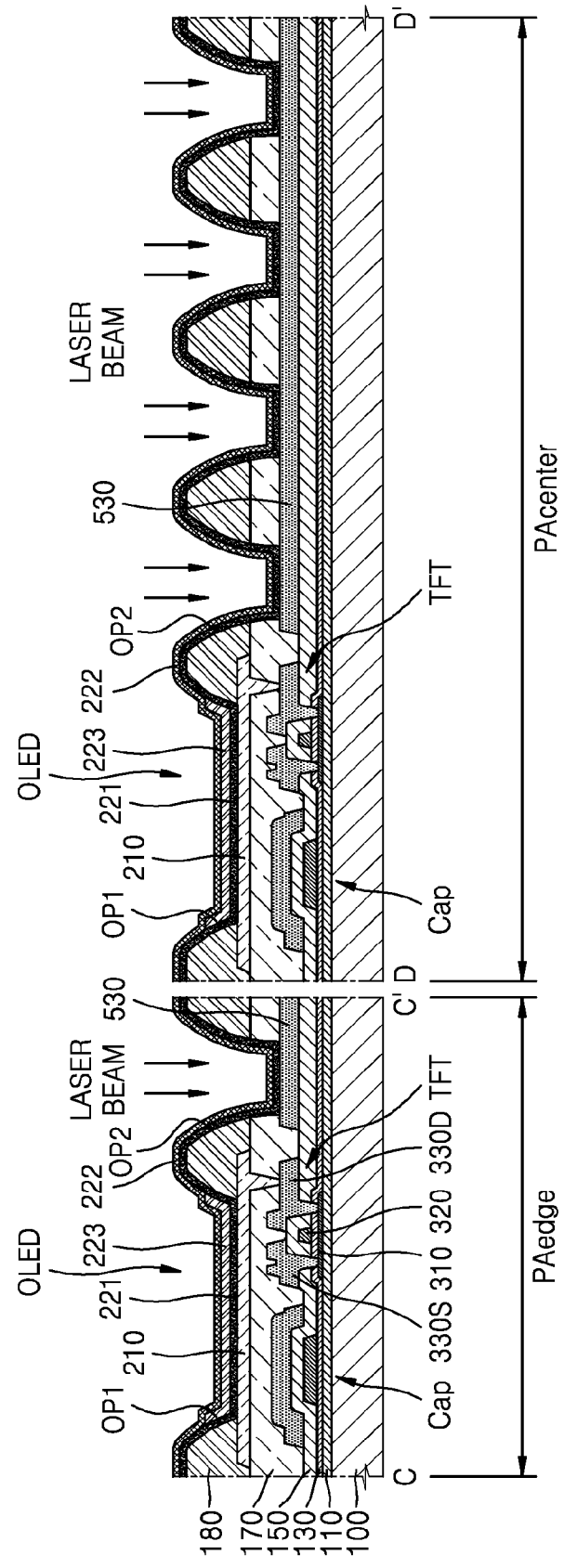

Referring to FIG. 15B, the first intermediate layer 221 is formed on the upper portion of the pixel electrode 210 exposed through the first opening OP1, the upper surface of the pixel define layer 180 located between the pixel electrode 210, and the auxiliary line 530 exposed through the through holes TH. The emission layer 223 is formed on the first intermediate layer 221 to be located in the first opening OP1, and the second intermediate layer 222 is formed on the first intermediate layer 221. Although a process of forming the second intermediate layer 222 is included in the exemplary embodiment shown in FIGS. 15A to 15D, exemplary embodiments of the present inventive concept are not limited thereto. For example, the second intermediate layer 222 may be omitted.

Figure 15C:
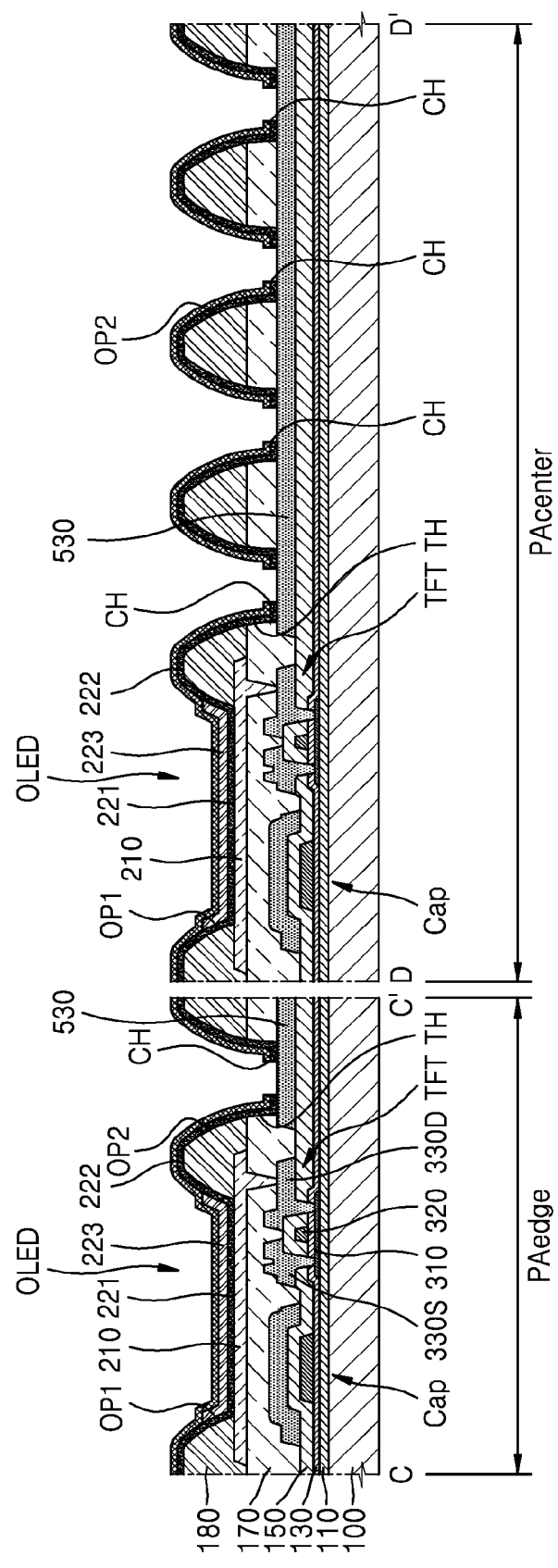

Referring to FIGS. 15B and 15C, a laser beam is radiated to remove portions of the first and second intermediate layers 221 and 222 formed in the second opening OP2 such that the contact hole CH is formed. The size of a laser beam irradiated onto the first pixel region PAcenter and the size of a laser beam irradiated onto the second pixel region PAedge may be identical to each other. However, since a laser beam is irradiated onto a plurality of positions in the first pixel region PAcenter, the number of the contact holes CH formed in the first pixel region PAcenter is greater than that of the contact holes CH formed in the second pixel region PAedge.

Figure 15D:
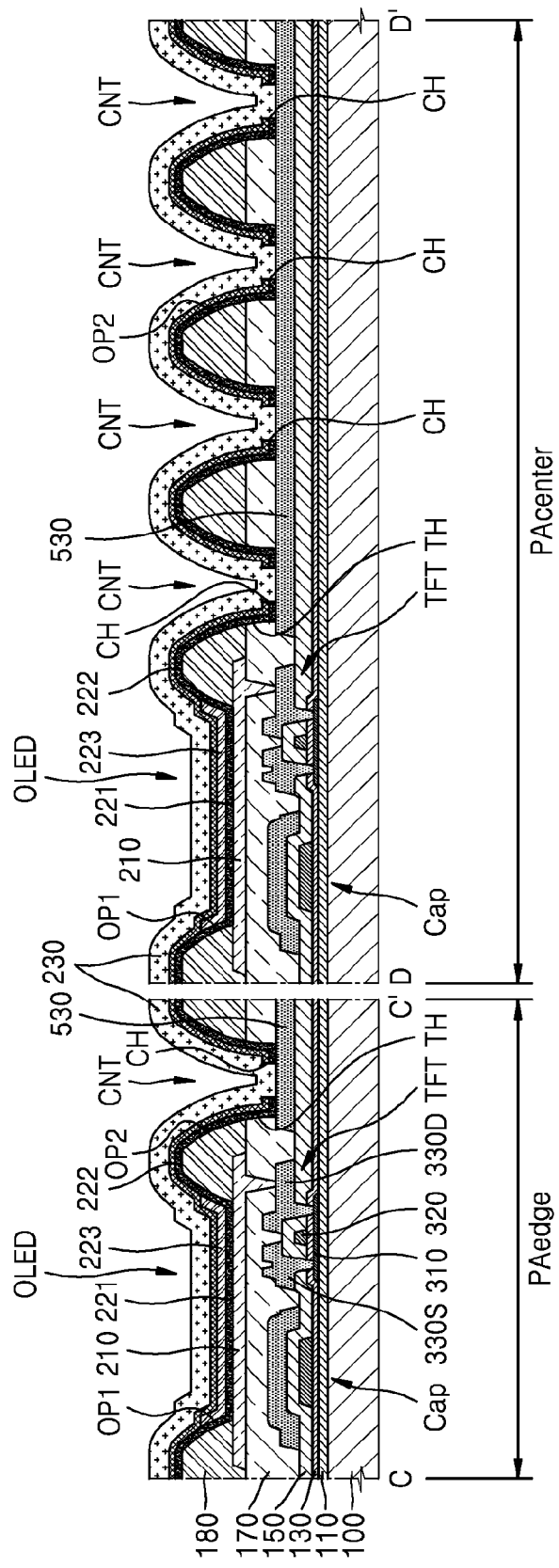

Referring to FIG. 15D, the opposite electrode 230 is formed in an area corresponding to the pixel electrode 210 and the auxiliary line 530. The opposite electrode 230 may directly contact the auxiliary line 530 exposed through the contact hole CH.

As described above, since the number of the contact holes CH in the first pixel region PAcenter is greater than that of the contact holes CH in the second pixel region PAedge, the total contact area between the auxiliary line 530 and the opposite electrode 230 in the first pixel region PAcenter is larger than the total contact area between the auxiliary line 530 and the opposite electrode 230 in the second pixel region PAedge.

The total contact area between the auxiliary line 530 and the opposite electrode 230 may be different for each pixel region according to the above-described manufacturing method. The total contact area between the auxiliary line 530 and the opposite electrode 230 may be determined by the number of the contact holes CH. As described above with reference to FIGS. 1 to 3A, by using the manufacturing method according to the present exemplary embodiment, the number of the contact holes CH may be gradually decreased such that the total contact area between the auxiliary line 530 and the opposite electrode 230 gradually decreases from the first pixel region PAcenter toward the second pixel region PAedge. The contact hole CH for each pixel region may be formed symmetrically with respect to the imaginary bisector HL (see FIG. 2) that crosses the center portion AC of the display region AA.

As described above, the OLED display and the manufacturing method thereof according to exemplary embodiments of the present inventive concept, the organic light-emitting display apparatus may be easily manufactured and may have a high light-emitting stability.

It should be understood that the exemplary embodiments described therein should be considered in a descriptive sense only and not for purposes of limitation. Descriptions of features or aspects within each embodiment should typically be considered as available for other similar features or aspects in other embodiments.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light-emitting diode (OLED) display, comprising:
    pixel electrodes, each pixel electrode corresponding to a pixel region disposed in a display region of a substrate;
    a first pixel region disposed at a center portion of the display region;
    a second pixel region disposed at an edge portion of the display region;
    auxiliary lines, each auxiliary line disposed adjacent to at least one pixel electrode;
    emission layers disposed on the pixel electrodes; and
    an opposite electrode disposed on the emission layers, the opposite electrode contacting each of the auxiliary lines through contact holes,
    wherein a total contact area between the opposite electrode and an auxiliary line in the first pixel region is greater than a total contact area between the opposite electrode and the auxiliary line in the second pixel region.

2. The OLED display of claim 1, wherein a size of at least one of the contact holes in the first pixel region is greater than a size of at least one of the contact holes in the second pixel region.

3. The OLED display of claim 1, wherein a number of contact holes in the first pixel region is greater than a number of contact holes in the second pixel region.

4. The OLED display of claim 1, wherein the total contact area between the opposite electrode and the auxiliary line gradually decreases in a direction from the first pixel region toward the second pixel region.

5. The OLED display of claim 1, wherein the contact holes are formed symmetrically in the display region with respect to an imaginary bisector that crosses the center portion of the display region.

6. The OLED display of claim 1, wherein the auxiliary lines are disposed parallel to each other, each of the auxiliary lines crossing the entire display region from a first side of the display region to a second side of the display region.

7. The OLED display of claim 6, wherein the first side of the display region is a first long side portion of the display region and the second end of the display region is a second long side portion of the display region.

8. The OLED display of claim 1, further comprising:
    a first power voltage line configured to apply a first power voltage to the pixel electrodes; and
    a second power voltage line configured to apply a second power voltage to the opposite electrode, the second power voltage being lower than the first power voltage,
    wherein the second power voltage line comprises a first main power line and a second main power line formed at opposing sides of the display region,
    wherein opposing ends of the auxiliary lines electrically connect to the first main power line and the second main power line, respectively, and
    wherein the auxiliary lines cross the display region.

9. The OLED display of claim 1, further comprising:
    a pixel define layer comprising first openings formed in the pixel electrodes and second openings formed in the auxiliary lines, the pixel define layer disposed between the plurality of pixel electrodes and the plurality of auxiliary lines; and
    an intermediate layer disposed on an upper surface of the pixel define layer, the pixel electrodes, and the auxiliary lines,
    wherein the intermediate layer comprises contact holes that expose an upper portion of each of the auxiliary lines.

10. The OLED display of claim 1, further comprising a thin film transistor (TFT) comprising: a source electrode; a drain electrode; and a gate electrode,
    wherein each auxiliary line comprises:
        a first auxiliary line layer disposed on a same layer as at least one of the electrodes of the TFT; and
        a second auxiliary line layer disposed on a same layer as the pixel electrode.

11. The OLED display of claim 10, wherein the second auxiliary line layer directly contacts the opposite electrode via the contact holes.

12. The OLED display of claim 10, wherein the source electrode and the drain electrode are disposed on the gate electrode, and the first auxiliary line layer is disposed on a same layer as the source electrode and the drain electrode.

13. The OLED display of claim 10, wherein the first auxiliary line layer extends in a first direction and crosses the display region, and the second auxiliary line layer is patterned in an island form at a position corresponding to each of the contact holes.

14. The OLED display of claim 1, wherein the auxiliary lines are disposed on a same layer as the pixel electrodes and formed of a same material as the pixel electrodes.

15. The OLED display of claim 1, further comprising a TFT comprising: a source electrode; a drain electrode; and a gate electrode,
    wherein each of the auxiliary lines is disposed on a same layer as the drain electrode and the source electrode and is formed of a same material as the drain electrode and the source electrode.

* * * * *